United States Patent
Kawai et al.

(10) Patent No.: US 6,861,269 B2
(45) Date of Patent: Mar. 1, 2005

(54) ELECTRIC-CIRCUIT FABRICATING METHOD AND SYSTEM, AND ELECTRIC-CIRCUIT FABRICATING PROGRAM

(75) Inventors: Takayoshi Kawai, Okazaki (JP); Kazuo Mitsui, Okazaki (JP); Seigo Kodama, Ama-gun (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 97 days.

(21) Appl. No.: 10/245,371

(22) Filed: Sep. 18, 2002

(65) Prior Publication Data

US 2003/0059964 A1 Mar. 27, 2003

(30) Foreign Application Priority Data

Sep. 21, 2001 (JP) ......................................... 2001-288617

(51) Int. Cl.⁷ .............................................. H01L 21/66
(52) U.S. Cl. ............................. 438/14; 438/15; 438/6; 438/10
(58) Field of Search ............................. 438/6, 10, 14, 438/17, 110, 107

(56) References Cited

U.S. PATENT DOCUMENTS

| | | | | |
|---|---|---|---|---|
| 5,663,076 A | * | 9/1997 | Rostoker et al. ............... | 438/14 |
| 6,417,068 B1 | * | 7/2002 | Bruce et al. ................. | 438/401 |
| 6,555,400 B2 | * | 4/2003 | Farnworth et al. ............ | 438/17 |
| 6,589,801 B1 | * | 7/2003 | Yoon et al. .................... | 438/15 |

FOREIGN PATENT DOCUMENTS

| | | |
|---|---|---|
| JP | A 2000-114799 | 4/2000 |
| JP | A 2000-124676 | 4/2000 |

* cited by examiner

*Primary Examiner*—John F. Niebling
*Assistant Examiner*—Olivia Luk
(74) *Attorney, Agent, or Firm*—Oliff & Berridge, PLC

(57) ABSTRACT

A method of fabricating an electric circuit, including first and second working processes of performing respective first and second working operations on a circuit substrate, where3in the first working process includes a first substrate-identifying step of obtaining substrate identifying information identifying the substrate on which the first working operation is to be performed, a specific-information obtaining step of recognizing a specific-information providing portion of the substrate, to obtain specific information indicating at least one specific characteristic of the substrate, a first working step of performing the first working operation on the basis of the obtained specific information, and a specific-information storing step of storing the specific information in relation to the substrate identifying information, and the second working process includes a second substrate-identifying step of obtaining the substrate identifying information identifying the substrate on which the second working operation is to be performed, and a second working step of performing the second working operation on the basis of the specific information stored in relation to the substrate identifying information. Also disclosed are electric-circuit fabricating system and control program suitable to practice the method.

18 Claims, 16 Drawing Sheets

FIG. 15

| SUBSTRATE IDENTIFIER | WORKING AREA NO. | AREA-POSITION SPECIFYING INFORMATION | AREA-WORKING INHIBIT/NON-INHIBIT INFORMATION |
|---|---|---|---|
| XYZ01234 | 1 | $\Delta Xb_1, \Delta Yb_1, \Delta \theta b_1$ | 0 |
| ″ | 2 | $\Delta Xb_2, \Delta Yb_2, \Delta \theta b_2$ | 0 |
| ″ | 3 | $\Delta Xb_3, \Delta Yb_3, \Delta \theta b_3$ | 1 |
| ″ | 4 | $\Delta Xb_4, \Delta Yb_4, \Delta \theta b_4$ | 0 |

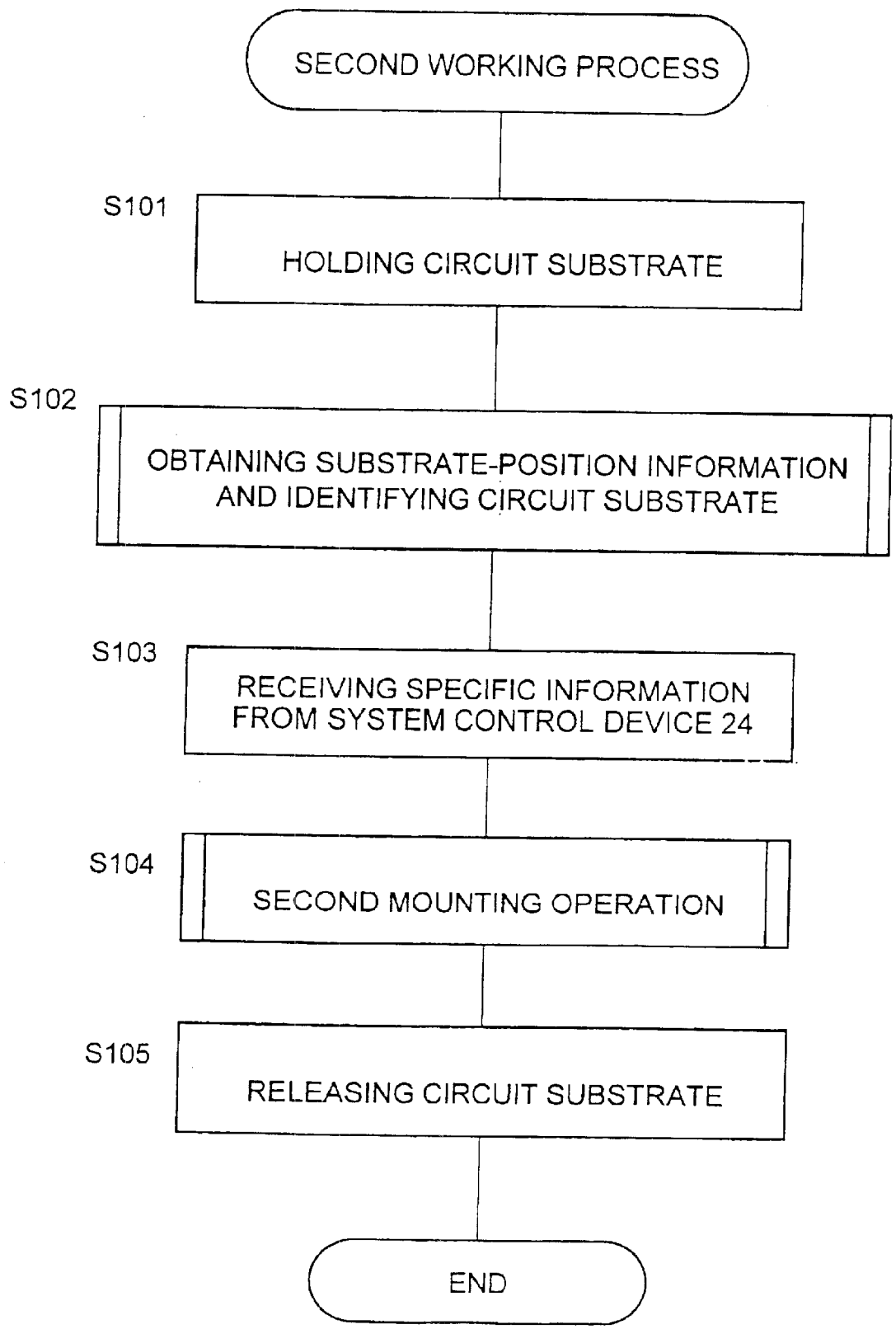

ELECTRIC-CIRCUIT FABRICATING METHOD AND SYSTEM, AND ELECTRIC-CIRCUIT FABRICATING PROGRAM

The present application is based on Japanese Patent Application No. 2001-288617 filed Sep. 21, 2001, the content of which is incorporated herein by reference.

BACKGROUND OF THE INVENTION

1. Field of the Invention

The present invention relates to a method of performing predetermined working operations on a circuit substrate, such as an operation to mount electric components (including electronic components) on the circuit substrate, to fabricate an electric circuit, a system operable to perform such working operations for fabricating the electric circuit, and a control program executed by a computer to perform the working operations for fabricating the circuit substrate.

2. Discussion of Related Art

An electric circuit is commonly fabricated by an electric-circuit fabricating system, which includes a solder-paste applying device, an adhesive applying device, an electric-component mounting device, an automatically inspecting device, and a re-flow furnace device, which are arranged in a line in the order of description from the upstream side toward the downstream side. Each circuit substrate loaded onto the system is successively transferred through those working devices, and a predetermined working operation is performed on the circuit substrate, by each working device, so that the electric circuit is fabricated.

In some of such fabricating systems, each of the working devices is operated on the basis of specific information indicating at least one specific characteristic of the circuit substrate on which the working operation is to be performed. The specific information may be obtained by reading some form of an indicator provided on the circuit substrate. Where each circuit substrate has a plurality of working areas in which respective working operations are to be performed, for instance, the specific information includes area-position specifying information which specifies the positions of those working areas relative to the circuit substrate, namely, the positions of the working areas within the circuit substrate. To obtain the area-position specifying information, an imaging device is provided, for example, to take images of fiducial marks which are provided on the circuit substrate and which indicate the positions of the individual working areas. In this case, the area-position specifying information is obtained by processing image data indicative of the images taken by the imaging device.

In the conventional fabricating systems, each of the working devices is arranged to obtain the specific information on the circuit substrate, and perform the predetermined working operation on the circuit substrate, on the basis of the specific information obtained by itself.

In some fabricating systems, some specific information indicated above is the same for two or more of the working devices. In this case, the conventional system arranged such that each working device obtains the specific information by itself suffers from a relatively long time required to complete the fabrication of the electric circuit and an accordingly low production efficiency due to unnecessary repetition of the operation to obtain the specific information on the circuit substrate.

SUMMARY OF THE INVENTION

It is therefore an object of the present invention to improve the efficiency of fabrication of an electric circuit. This object may be achieved according to any one of the following modes of the present invention in the form of an electric-circuit fabricating method, an electric-circuit fabricating system and an electric-circuit fabricating control program, each of which is numbered like the appended claims and depends from the other mode or modes, where appropriate, for easier understanding of technical features disclosed in the present application and possible combinations of those features. However, it is to be understood that the invention is not limited to those technical features or combinations thereof, and that any one of a plurality of technical features described below with respect to any one mode of the invention may be a subject matter of the present invention, without the other technical feature or features being combined with that one technical feature.

(1) A method of fabricating an electric circuit, comprising a first working process of performing a predetermined first working operation on a circuit substrate, and a second working process of performing a predetermined second working operation on the circuit substrate, wherein the first working process includes a first substrate-identifying step of obtaining substrate identifying information identifying the circuit substrate on which the predetermined first working operation is to be performed, a specific-information obtaining step of recognizing a specific-information providing portion of the circuit substrate, to obtain specific information indicating at least one specific characteristic of the circuit substrate, a first working step of performing the predetermined first working operation on the basis of the obtained specific information, and a specific-information storing step of storing the specific information in relation to the substrate identifying information, and the second working process includes a second substrate-identifying step of obtaining the substrate identifying information identifying the circuit substrate on which the predetermined second working operation is to be performed, and a second working step of performing the predetermined second working operation on the basis of the specific information stored in relation to the substrate identifying information.

The electric-circuit fabricating method according to the above mode (1) of the present invention may be practiced by an electric-circuit fabricating system which includes a plurality of working devices arranged in a line to fabricate an electric circuit, as described above. In the present method, the first working operation performed by an upstream one of the working devices and the second working operation performed by a downstream one of the working device are both performed on the basis of common specific information. Namely, the specific information indicating at least one specific characteristic of the circuit substrate is obtained in the first working process, by recognizing the specific-information providing portion of the circuit substrate, and the first working operation is performed on the basis of the obtained specific information. The specific information is stored in relation to the substrate identifying information identifying the circuit substrate, so that the stored specific information may be utilized to perform the second working operation in the second working process, when the same substrate identifying information is obtained in the second working process.

The present method eliminates a step of recognizing the specific-information providing portion of the circuit substrate to obtain the specific information which is used to perform the second working operation. Accordingly, the present method reduces the time required to fabricate the electric circuit. Further, the specific information obtained in the first working process is stored in relation to the substrate identifying information, that is, in relation to the specific circuit substrate, so that the appropriate specific information can be utilized in the second working process. In this respect, it is noted that the system including a plurality of working devices which are arranged in a line and through which circuit substrates are successively transferred may suffer from a failure of any circuit substrate to reach the next working device or a change in the order of arrangement of the circuit substrate in the line, for some reason or other. In this event, the present method prevents an erroneous use of the specific information in the second working process, that is, the use of the specific information for the circuit substrate which is different from the circuit substrate on which the second working operation is performed.

The present method is applicable to any form of fabrication of an electric circuit, which includes at least the first and second working processes described above, namely, which consists of the first and second working processes described above or three or more working processes including the first and second working processes. In the latter case, any two of the three or more working processes may be the first and second working processes described above. Further, the specific information obtained in the first working process may be utilized in the two or more subsequent working processes including the second working process. The working operations in the first and second working processes or in the three or more working processes are not particularly limited, provided those working operations are required to fabricate the desired electric circuit. This aspect will be described in greater detail.

The substrate identifying information identifies the specific circuit substrate (specific kind or configuration of the circuit substrate) as distinguished from the other circuit substrate. The manner of obtaining the substrate identifying information in the first and second substrate-identifying steps in the first and second working processes is not particularly limited. For example, each circuit substrate is provided with a substrate-identifier portion which identifies the circuit substrate with a suitable medium such as an optical, thermal, audio or magnetic medium. The substrate-identifier portion may be recognized by appropriate means depending upon the specific type or nature of the substrate-identifier portion. For instance, a substrate ID mark is provided in the substrate-identifier portion of the circuit substrate. In this instance, an image of the substrate ID mark is taken by a suitable imaging means, and the image data are processed to obtain the substrate identifying information. The imaging means may be an imaging device such as a CCD camera. The image data obtained by the imaging means may be processed by an image-data processing device such as a computer.

The specific information is not particularly limited, provided the specific information indicates one or more specific characteristics or properties of the circuit substrate and is required for the first and second working operations. An entirety of the specific information obtained in the first working process need not be used in the first and second working processes. Namely, only a portion of the specific information may be used in the first or second working process, and the portions of the specific information used in the first and second working processes are not necessarily the same. The specific information may be obtained either before or after the first working operation is performed. Examples of the specific information will be described with respect to the following mode (2) of the invention.

The manner of recognizing the specific-information providing portion and obtaining the specific information is not particularly limited. For example, each circuit substrate is provided with a specific-information providing portion which provides the specific information with a suitable medium such as an optical, thermal, audio or magnetic medium, as described above with respect to the substrate-identifier portion for the substrate identifying information. The specific-information providing portion may be recognized by appropriate means depending upon the specific type or nature of the specific-information providing portion. For instance, a specific-information mark is provided in the specific-information providing portion of the circuit substrate. In this instance, an image of the specific-information mark is taken by a suitable imaging means, and the image data are processed to obtain the specific information. The imaging means may be an imaging device such as a CCD camera. The image data obtained by the imaging means may be processed by an image-data processing device such as a computer. The same combination of imaging device and image-data processing device may be used for obtaining both the substrate identifying information and the specific information.

The specific information may be stored in a memory device of a computer. In this case, the specific information as obtained in the first working process may be subjected to suitable processing operation or operations involving calculation, classification, selection and deletion, analysis, etc. before the specific information is stored in the memory device. The memory device may be provided in at least one of two working devices operable to perform the respective first and second working processes, or in a system control device arranged to effect a centralized or coordinated control of the working devices. In either of these cases, the specific information is transferred between the working devices, or between the working devices and the system control device.

(2) A method according to the above mode (1), wherein the circuit substrate has at least one working area, and the specific information includes area-working inhibit/non-inhibit information indicating whether the working operation in each working area is inhibited or permitted.

Where the circuit substrate has a plurality of working areas in which respective wiring patterns are printed, any one of the printed wiring patterns in the working areas may be defective. In this case, an operation to apply a solder paste to the working area having the defective wiring pattern, or an operation to mount electric components in this working area is not only unnecessary, but also results in the production of a defective product. In this case, therefore, it is desirable or required to inhibit a working operation in the working area having the defective wiring pattern. In this respect, the method according to the above mode (2) is effective to improve the production efficiency and prevent the defective product, since the working operation is inhibited in the working area having the defective wiring pattern, according to the area-working inhibit/non-inhibit information indicating that the working operation in that working area is inhibited.

The area-working inhibit/non-inhibit information may be used for purposes other than inhibiting the working operation in the presence of a defective wiring pattern in a given one of the working areas of the circuit substrate. For example, the area-working inhibit/non-inhibit information may be used where only the first working operation or the second working operation is selectively performed in a specific working area. In this case, the area-working inhibit/non-inhibit information is used to inhibit or permit the first or second working operation in the specific working area. The area-working inhibit/non-inhibit information may be used in the first and second working processes to inhibit or permit both of the first and second working operations in each working area, or used in only the second working process to inhibit or permit only the second working operation. In the method according to the above mode (2), the circuit substrate is provided with a specific-information providing portion that provides the area-working inhibit/non-inhibit information. The specific-information providing portion may be provided either within or outside the above-indicated at least one working area. Where the circuit substrate has a plurality of working areas, specific-information providing portions may be provided within the respective working areas, or a single specific-information providing portion may be provided at one location on the circuit substrate.

(3) A method according to the above mode (1) or (2), wherein the circuit substrate has at least one working area, and the specific information includes area-position specifying information indicating a position of each of the at least one working area relative to the circuit substrate.

Where the circuit substrate has a plurality of working areas in which electric components are mounted, a reference or fiducial position may be set for each of the working devices, so that the spots at which the electric components are mounted are defined with respect to the fiducial position. This arrangement assures a high degree of positioning accuracy of the electric components mounted in each working area. Where all of the working areas have the same printed wiring pattern, the electric components may be mounted in all of the working areas, according to the same component-mounting program. The electric components to be mounted in connection with a given printed wiring pattern may include selected components or a group or groups of selected components that require comparatively high accuracy of positioning relative to the wiring pattern. In this case, fiducial positions may be set near the spots at which the selected components or group or groups of selected are to be mounted, so that the selected components can be positioned with high accuracy, with respect to the fiducial positions. The above-indicated spots at which the selected components are to be mounted may be considered to be the working areas.

(4) A method according to any one of the above modes (1)–(3), wherein each of the first and second working processes further includes a substrate-holding step of holding the circuit substrate, and a substrate-position-information obtaining step of recognizing a substrate-fiducial-position indicating portion of the circuit substrate, to obtain substrate-position information indicating the position at which the circuit substrate is held, and wherein each of the first and second working operations is performed on the basis of the substrate-position information.

In the fabrication of an electric circuit, each working operation is usually performed on the circuit substrate while the circuit substrate is held in position, by a suitable substrate holding device. The actual position at which the circuit substrate is held by the substrate holding device may more or less deviate from the nominal working position of the circuit substrate. To assure high accuracy of the working operation on the circuit substrate, the circuit substrate is preferably provided with the substrate-fiducial-position indicating portion indicative of the actual position of the circuit substrate, for detecting positioning errors of the circuit substrate with respect to the nominal working position at which the circuit substrate must be held. The working operation on the circuit substrate is performed so as to compensate for the detected positioning errors of the circuit substrate. Thus, the method according to the above mode (4) is arranged such that the first and second working operations are performed on the basis of both the substrate-position information and the specific information. The substrate-position information may be correlated with the area-position specifying information, so that the area-position specifying information indicates the position of each working area relative to the position of the circuit substrate indicated by the substrate-position information.

(5) A method according to the above mode (4), wherein the substrate-position indicating portion has at least one substrate-position fiducial mark provided on a surface of the circuit substrate, and the substrate-position-information obtaining step comprises taking an image of each of the above-indicated at least one substrate-position fiducial mark, and obtaining the substrate-position information on the basis of the image of each substrate-position fiducial mark.

In the method according to the above mode (5) wherein the substrate-position indicating portion has at least one substrate-position fiducial mark, the substrate-position information can be easily obtained by processing image data indicative of the image of each substrate-position fiducial mark, and the thus obtained substrate-position information accurately indicates the position at which the circuit substrate is actually held. Preferably, the substrate-position indicating portion has two or more substrate-position fiducial marks, which are desirably spaced apart from each other. For example, the substrate-position fiducial marks are located at respective corner portions of a rectangle of the circuit substrate. For instance, the substrate-position information consists of horizontal positioning errors of the circuit substrate in two mutually perpendicular directions in a plane parallel to the surface of the circuit substrate, and an angular positioning error of the circuit substrate about an axis perpendicular to the above-indicated plane. Like the specific information, the substrate-position information may be obtained by operating an imaging device such as a CCD camera to take the image of each substrate-position fiducial mark. The image is processed by an image-data processing device, for example, by an image-data processing computer. The same combination of imaging device and image-data processing device may be used for obtaining the substrate-position information and at least one of the substrate identifying information and the specific information which have been described.

(6) A method according to the above mode (5), wherein the circuit substrate has at least one working area, and the specific information includes area-working inhibit/non-inhibit information indicating whether the working operation in each of the at least one working area is inhibited or permitted, and wherein the specific-information providing portion has an area-working inhibit/non-inhibit mark for each of the at least one working area, and the specific-information obtaining step comprises taking an image of the area-working inhibit/non-inhibit mark to obtain the area-working inhibit/non-inhibit information.

The method according to the above mode (6) requires the specific-information providing portion to have the area-working inhibit/non-inhibit mark, which is imaged to obtain the area-working inhibit/non-inhibit information described above with respect to the above mode (2). The area-working inhibit/non-inhibit mark may be an area-working inhibit mark inhibiting the working operation in the corresponding working area, or an area-working permit mark permitting the working operation in the corresponding working area. The technical feature relating to the area-working inhibit/non-inhibit mark described above with respect to the above mode (6) is available without the feature of the substrate-position information or substrate-position fiducial mark described above with respect to the above mode (5). Namely, the method according to the above mode (2) may include the feature of the area-working inhibit/non-inhibit mark.

(7) A method according to the above mode (6), wherein the image of the substrate-position fiducial mark and the image of the area-working inhibit/non-inhibit mark are taken by a same imaging device in the first working process.

In the method according to the above mode (7) wherein the same imaging device is used to take the images of the substrate-position fiducial mark or marks and the area-working inhibit/non-inhibit mark for each working area, the first working process can be simplified, and a working device provided to perform the first working process can be available at a reduced cost.

(8) A method according to any one of the above modes (5)–(7), wherein the circuit substrate has at least one working area, and at least one of the above-indicated predetermined first and second working operations is performed in the at least one working area, and wherein the specific information includes area-position specifying information indicating a position of each of the at least one working area relative to the circuit substrate, and wherein the specific-information providing portion has an area-position fiducial mark for each of the at least one working area, and the specific-information obtaining step comprises taking an-image-of the area-position fiducial mark to obtain the area-position specifying information.

The method according to the above mode (8) requires the specific-information providing portion to have the area-position fiducial mark, which is imaged to obtain the area-position specifying information described above with respect to the above mode (3). The technical feature relating to the area-position fiducial mark described above with respect to the above mode (8) is available without the feature of the substrate-position information or substrate-position fiducial mark described above with respect to the above mode (5). Namely, the method according to the above mode (3) may include the feature of the area-position fiducial mark.

(9) A method according to the above mode (8), wherein the image of each of the at least one substrate-position fiducial mark and the image of the area-position fiducial mark are taken by a same imaging device in the first working process.

In the method according to the above mode (9) wherein the same imaging device is used to take the images of the substrate-position fiducial mark or marks and the area-position fiducial mark for each working area, the first working process can be simplified, and a working device provided to perform the first working process can be available at a reduced cost, as in the method according to the above mode (7).

(10) A method according to any one of the above modes (5)–(9), wherein the circuit substrate has a substrate ID mark identifying the circuit substrate, and each of the first substrate-identifying step and the second substrate-identifying step comprises taking an image of the substrate ID mark, to obtain the substrate identifying information identifying the circuit substrate.

In the method according to the above mode (10) wherein the substrate ID mark provided on the circuit substrate is used to identify the circuit substrate, the substrate identifying information may be easily obtained by imaging this substrate ID mark. Although the present method requires the substrate-position information to be obtained to detect the position at which the circuit substrate is held, the substrate ID mark may be recognized by a suitable reader before the circuit substrate is held. For example, the substrate ID mark in the form of a bar code may be read by a bar code reader when the circuit substrate is located on a conveyor by which the circuit substrate is loaded onto working devices provided to perform the first and second working processes.

(11) A method according to the above mode (10), wherein the image of each of the above-indicated at least one substrate-position fiducial mark and the image of the substrate ID mark are taken by a same imaging device in each of the first and second working processes.

In the method according to the above mode (11) wherein the same imaging device is used to take the images of the substrate-position fiducial mark or marks and the substrate ID mark, the first and second working processes can be simplified, and working devices provided to perform the first and second working processes can be available at a reduced cost, as in the method according to the above modes (7) and (9).

(12) A method according to the above mode (11), wherein the substrate ID mark is located adjacent to one of the above-indicated at least one substrate-position fiducial mark, and an image of the substrate ID mark and an image of the one of the at least one substrate-position fiducial mark are simultaneously taken within an imaging area of the above-indicated same imaging device.

The substrate ID mark may be provided at only one spot on each circuit substrate, which spot may be located at the same predetermined position on all of the circuit substrates. Where the substrate ID mark is located adjacent to one of the at least one substrate-position fiducial mark, a distance of relative movement of the imaging device and the circuit substrate required to take the images of the substrate-position fiducial mark and the substrate ID mark can be reduced, so that these marks can be imaged efficiently by the imaging device. Usually, each circuit substrate is provided with two substrate-position fiducial marks located at respective diagonally opposed two corner portions of a rectangle of the circuit substrate, as described above. In this case, the substrate ID mark is desirably located as close as possible to one of the two substrate-position fiducial marks, for instance, spaced from this one substrate-position fiducial mark by a distance not larger than $1/10$ of a diagonal straight line connecting the two substrate-position fiducial marks, preferably, by a distance not larger than $1/15$ of the diagonal straight line, and more preferably, by a distance not larger than $1/20$ of the diagonal straight line. In the method according to the above mode (12), the image of the substrate ID mark located adjacent to one of the at least one substrate-position fiducial mark and the image of this one substrate-position fiducial mark are taken within the imaging area or field of vision of the imaging device, so that imaging device and the circuit substrate are not required to be moved relative to each other to take those images. Further, the simultaneous imaging of the two marks permits a further improvement in the efficiency of the first and second working processes.

(13) A method according to any one of the above modes (10)–(12), wherein the substrate ID mark consists of a two-dimensional code.

The use of the two-dimensional code such as a bar code or QR code as the substrate ID mark is advantageous for its relatively large volume of information per unit surface area, so that the size of the substrate ID mark can be reduced.

Further, the use of the two-dimensional code as the substrate ID mark permits an easier arrangement for enabling the imaging device to image the substrate ID mark and the adjacent substrate-position fiducial mark within the imaging area of the imaging device.

(14) A method according to any one of the above modes (1)–(13), wherein each of at least one of the predetermined first and second working operations is selected from a group consisting of: an operation to apply to a surface of the circuit substrate a solder paste for fixing electric components on the surface of the circuit substrate; an operation to apply to the surface of the circuit substrate an adhesive for fixing electric components on the surface of the circuit substrate; an operation to mount electric components on the surface of the circuit substrate; and an operation to inspect the working operation performed on the surface of the circuit substrate.

The principle of the method according to the above mode (1) of the present invention is available for a wide variety of working operations which include any one or ones of the working operations described above with respect to the above mode (14) by way of example.

(15) An electric-circuit fabricating system including a first fabricating apparatus operable to perform a predetermined first working operation on a circuit substrate, and a second fabricating apparatus disposed downstream of the first fabricating apparatus and operable to perform a predetermined second working operation on the circuit substrate, wherein the first fabricating apparatus includes a first substrate identifying device operable to obtain substrate identifying information identifying the circuit substrate on which the predetermined first working operation is to be performed, a specific-information obtaining device operable to obtain specific information indicating at least one specific characteristic of the circuit substrate, and a first working device operable to perform the predetermined first working operation on the basis of the specific information obtained by the specific-information obtaining device, the specific information being stored in a specific-information storing device, in relation to the substrate identifying information, and wherein the second fabricating apparatus includes a second substrate identifying device operable to obtain the substrate identifying information identifying the circuit substrate on which the predetermined second working operation is to be performed, and a second working device operable to perform the predetermined second working operation on the basis of the specific information stored in the specific-information storing device in relation to the substrate identifying information.

The electric-circuit fabricating system according to the above mode (15) of this invention is suitable to practice the electric-circuit fabricating method according to the above mode (1).

(16) An electric-circuit fabricating system according to the above mode (15), wherein each of the first and second substrate identifying devices includes an imaging device operable to take an image of a substrate identifier portion of the circuit substrate, and an image-data processing device operable to process image data indicative of the image of the substrate identifier portion, to obtain the substrate identifying information, and wherein the specific-information obtaining device includes an imaging device operable to take an image of the specific-information providing portion, and an image-data processing device operable to process image data indicative of the image of the specific-information providing portion, to obtain the specific information, In the system according to the above mode (16), the imaging device and the image-data processing device are provided to obtain the substrate identifying information and the specific information. Any one of the technical features of the above modes (1)–(14) of the invention in the form of the electric-circuit fabricating method is applicable to the electric-circuit fabricating system according to the above mode (15) or (16).

(17) A control program executed by a computer to fabricate an electric circuit, by performing a predetermined first working operation on a circuit substrate and a predetermined second working operation on the circuit substrate, the second working operation being different from the first working operation, the control program comprising a first working process and a second working process, wherein the first working process includes a first substrate-identifying step of obtaining substrate identifying information identifying the circuit substrate on which the predetermined first working operation is to be performed, a specific-information obtaining step of recognizing a specific-information providing portion of the circuit substrate, to obtain specific information indicating at least one specific characteristic of the circuit substrate, a first working step of performing the predetermined first working operation on the basis of the obtained specific information, and a specific-information storing step of storing the specific information in relation to the substrate identifying information, and wherein the second working process includes a second substrate-identifying step of obtaining the substrate identifying information identifying the circuit substrate on which the predetermined second working operation is to be performed, and a second working step of performing the predetermined second working operation on the basis of the specific information stored in relation to the substrate identifying information.

(18) A recording medium which is accessible by a computer and which stores a control program according to the above mode (17).

The control program according to the above mode (17) may be used to practice the electric-circuit fabricating method according to the above mode (1), and the recording medium according to the above mode (18) may be a recording medium such as a floppy disc, a CD-ROM, a RAM or a ROM, which stores the control program according to the above mode (17). Any one of the technical features of the above modes (1)–(14) is applicable to the control program of the above mode (17) and the recording medium of the above mode (18).

BRIEF DESCRIPTION OF THE DRAWINGS

The above and other objects, features, advantages and technical and industrial significance of the present invention will be better understood by reading the following detailed description of a preferred embodiment of the invention, when considered in connection with the accompanying drawings, in which:

FIG. 15 is a view showing a data format of various kinds of specific substrate information stored in a system control device in the first working process; and FIG. 16 is a flow chart illustrating a second working process performed by the second mounting device.

DETAILED DESCRIPTION OF THE PREFERRED EMBODIMENTS

<Overall Arrangement of Electric-Circuit Fabricating System>

Figure 1:
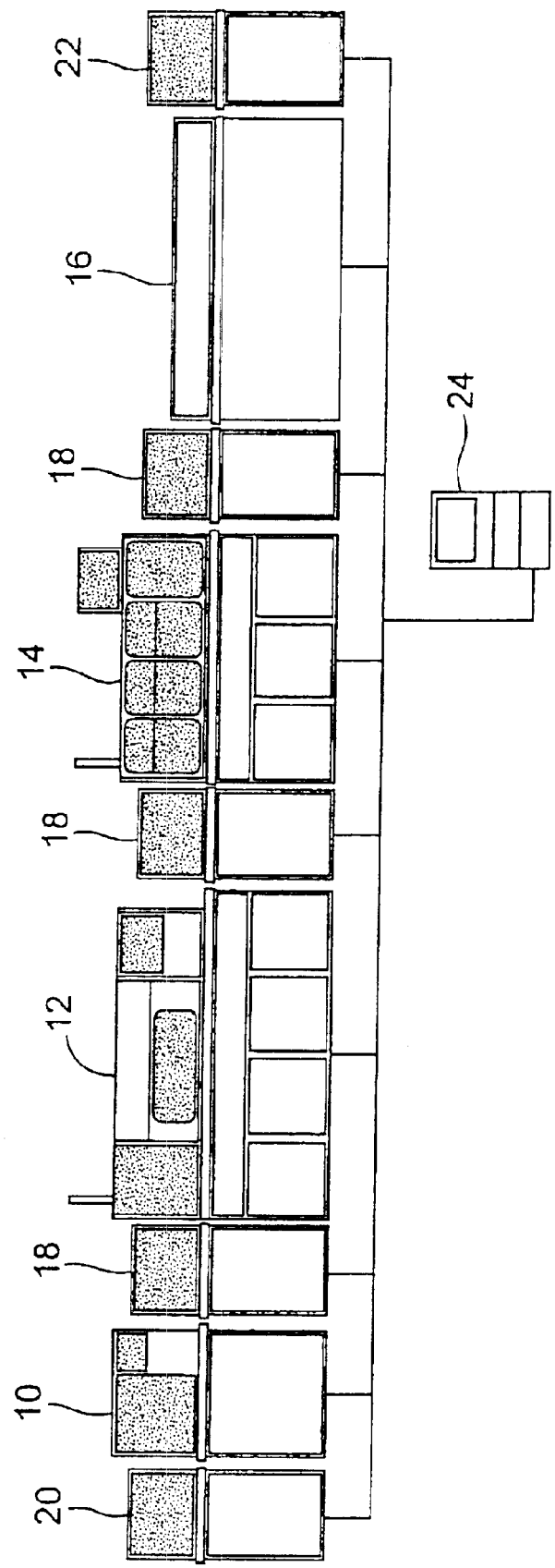
FIG. 1 is a view illustrating an electric-component mounting system including a plurality of working devices arranged in a line.

Referring first to FIG. 1, there is schematically shown an electric-circuit fabricating system arranged to fabricate an electric circuit. This electric-circuit fabricating system includes a solder-paste applying device 10 arranged to apply a solder pate (a creamy solder) to a circuit substrate 52 (shown in FIGS. 2 and 3), two electric-component mounting devices 12, 14 arranged to mount electric components 90 (shown in FIG. 3) on the circuit substrate 52, and a re-flow furnace device 16 arranged to fix the electric components 90 mounted on the circuit substrate 52, with the applied solder paste. These devices 10, 12, 14 and 16 are arranged in the order of description, in a direction from the upstream side toward the downstream side of the system, namely, in the right direction as seen in FIG. 1. Between the adjacent ones of the devices 10, 12, 14, 16, there is interposed a substrate transferring device 18 so as to connect the adjacent devices. Further, a substrate loading device 20 is disposed on the upstream side of the solder-paste applying device 10, to load the circuit substrates 52 one after another into the present electric-circuit fabricating system, while a substrate unloading device 22 is disposed on the downstream side of the re-flow furnace device 16, to unload the circuit substrates 52 from the present system. At a position spaced from a line of transfer of the circuit substrates 52 through the present system, there is disposed a system control device 24 which is constituted principally by a computer and which is arranged to implement a centralized or coordinated control of the devices of the system which have been described. The upstream electric-component mounting device 12, which will be referred to as the "first mounting device 12", is a mounting device of rotary head type having an indexing type mounting assembly which carries a plurality of mounting heads and which is intermittently rotated to turn the mounting heads about a common axis. On the other hand, the downstream electric-component mounting device 14, which will be referred to as the "second mounting device 14", is a mounting device of XY robot type. A predetermined set of electric components 90 is mounted on each circuit substrate 52 by the first and second mounting devices 12, 14, which are assigned to handle the electric components 90 of different kinds. For instance, the first mounting device 12 is assigned to mount the electric components 90 of comparatively small sizes on the circuit substrate 52, while the second mounting device 14 is assigned to mount the electric components 90 of comparatively large sizes or of unusual configurations on the same circuit substrate 52. In the present embodiment, these two mounting devices 12, 14 use various kinds of specific information in relation to identification of the circuit substrates 52, and respectively function as a first fabricating apparatus and a second fabricating apparatus, which are respectively assigned to perform first and second working operations in the form of first and second working processes, which are both component-mounting operations to mount the electric components 90 on the circuit substrates 52.

<Arrangement of First Mounting Device>

Figure 2:
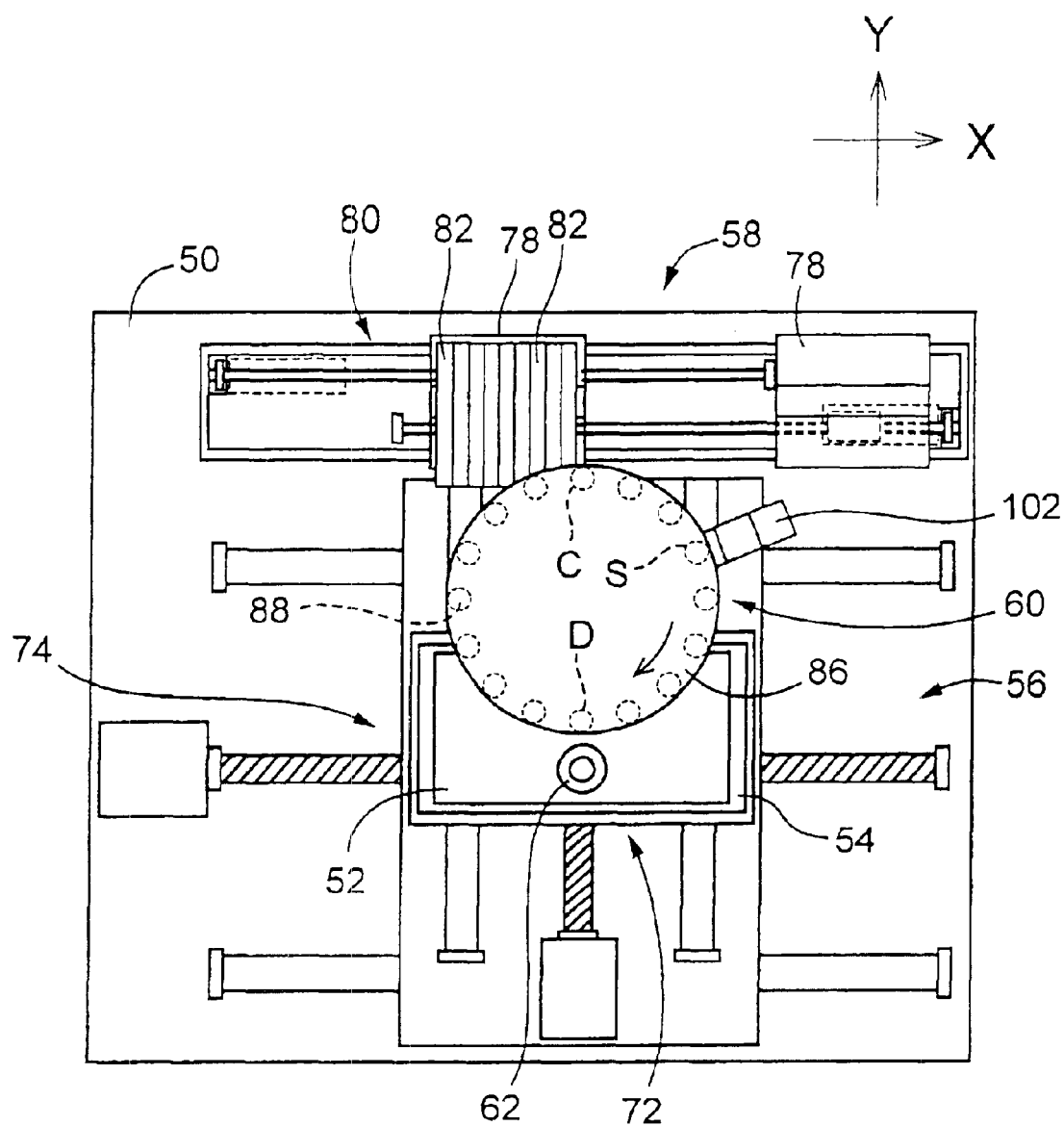
FIG. 2 is a plan view schematically showing a first mounting device in the form of an electric-component mounting device of rotary head type.
Figure 3:
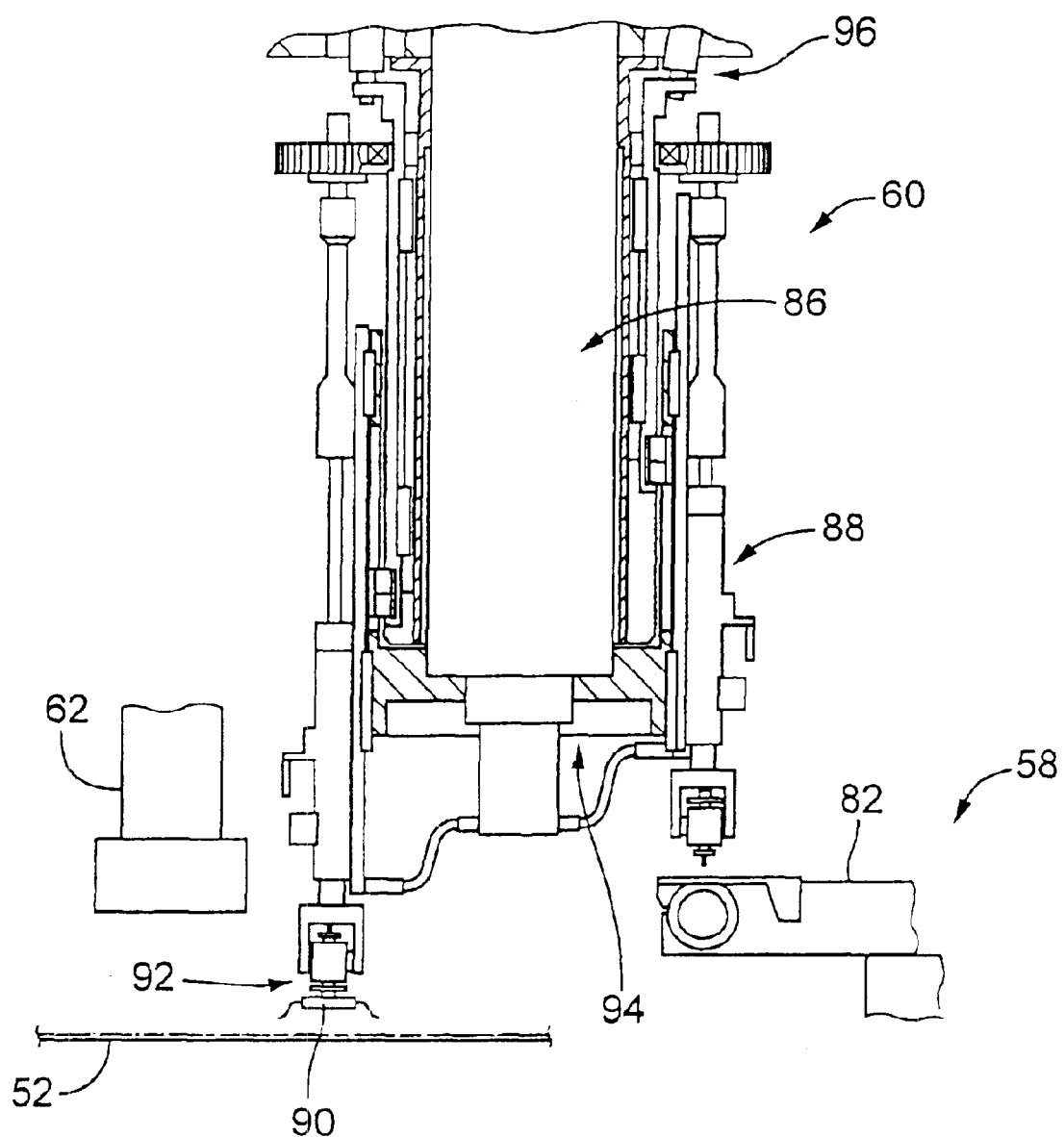
FIG. 3 is a side elevational view partly in cross section of an indexing type mounting assembly of the first mounting device.

Referring next to the plan view of FIG. 2 and the side elevational view of FIG. 3 partly in cross section, there are schematically shown the first mounting device 12 and an indexing-type mounting assembly 60 of the first mounting device 12. The first mounting device 12 includes: a main body 50; a substrate holding device 54 operable to hold a circuit substrate 52; an XY positioning device 56 disposed on the main body 50 and operable to move or position the substrate holding device 54 in an X-axis direction and a Y-axis direction; a component-supplying device 58 disposed on a portion of the main body 50 on a rear side (on an upper side as seen in FIG. 2) of the XY positioning device 56; the above-indicated indexing type mounting assembly 60 disposed on a portion of the main body 50 located above the substrate holding device 54 and the component-supplying device 58; a substrate imaging device 62 including an image-taking device in the form of a CCD camera disposed in front of the mounting assembly 60 and operable to take images of predetermined areas of a component-mounting surface of the circuit substrate 52; and a first mounting-device control device 64 (shown in FIG. 4) provided to control the above-indicated elements of the first mounting device 12. The first mounting device 12 is constructed as disclosed in co-pending application Ser. No. 10/159,008, and the mounting assembly 60 is constructed as disclosed in JP-A-6-342998 and co-pending application Ser. No. 09/863,431, while the component-supplying device 58 is constructed as disclosed in JP-B2-8-21791. Since the understanding of the specific constructions of the first mounting device 12, mounting assembly 60 and component-supplying device 58 is not necessary to understanding the principle of this invention, these devices 12, 60, 58 will be briefly described.

The substrate holding device 54 is arranged to hold and fix the circuit substrate 52 at a position almost aligned with a nominal working position, and is provided with a substrate conveyor (not shown) connected to the upstream and downstream substrate transferring devices 18. The XY positioning device 56 includes a Y-axis slide 72 which supports the substrate holding device 54 and which is movable in the Y-axis direction, and an X-axis slide 74 which supports the Y-axis slide 72 and which is movable in the X-axis direction. The XY positioning device 56 further includes drive sources in the form of servomotors and ballscrew-ballnut mechanisms operated by the servomotors to move the Y-axis slide 72 and the X-axis slide 74. The component-supplying device 58 includes two component-supply tables 78, a component-supply-table moving device 80 operable to move the two component-supply tables 78 independently of each other in the X-axis direction, and two sets of tape feeders 82 arranged on the respective to component-supply tables 78. Each tape feeder 82 is operable to feed a carrier tape which accommodates a succession of electric components 90, so that the electric components 90 are fed one after another to a component-supply portion of the tape feeder 82. In FIG. 2, only the set of tape feeders 82 arranged on one of the two component-supply tables 78 is shown. A selected one of the two component-supply tables 78 is moved in the X-axis direction to a predetermined component-supplying position at which the electric component 90 at the leading end of the non-used portion of the carrier tape of the selected tape feeder 82 is received by one of a plurality of mounting heads 88 (described below) of the mounting assembly 60 which is located at a predetermined component-receiving position.

The indexing type mounting assembly 60 includes an indexing body 86, and the above-indicated plurality of mounting heads 88 which are mounted on the indexing body 86 such that the mounting heads 88 are equiangularly spaced apart from each other in the circumferential or rotating direction of the indexing body 86 and such that the axis each mounting head 88 is perpendicular to the component-mounting surface of the circuit substrate 52 as held by the substrate holding device 54. Each mounting head 88 has a suction nozzle 92 at its lower end. The suction nozzle 92 can be communicated with a negative pressure source (not shown), so that the suction nozzle 92 is operable to hold the electric component 90 by suction under a negative pressure. The indexing body 86 is intermittently rotated by a rotary drive device (not shown), and cooperates with this rotary drive device to constitute a mounting-head turning device 94 which is operable to turn the mounting heads 88 about a common axis of turning, that is, about the axis of rotation of the indexing body 86, when the indexing body 86 is intermittently rotated. With the intermittent rotary motion of the indexing body 86, each of the mounting heads 88 is successively moved to and stopped at a plurality of working positions or stations including the above-indicated component-receiving position indicated at C in FIG. 2, and a component-mounting position D at which the electric component 90 is transferred from each mounting head 88 onto the printed-wiring board 52. The indexing body 86 is provided with a mounting-head elevating and lowering device 96 and a mounting-head rotating device 98 (shown in FIG. 4), which are operable to vertically move the mounting heads 88 at the component-receiving and component-mounting positions C, D, and rotate these mounting heads 88 about their axes, if necessary.

The above-indicated working positions at which each mounting head 88 is stopped further include a component imaging station S at which a component imaging device 102 is disposed to take an image of the electric component 90 as held by the suction nozzle 92. The component imaging device 102 includes an imaging device in the form of a CCD camera oriented so as to face upwards to take the image of the electric component 90 in the upward direction. Image data indicative of the image of the electric component 90 are processed by an image-data processing device in the form of a component-image-data processing unit 104 (shown in FIG. 4), which is incorporated in the first mounting-device control device 64. The component-image-data processing unit 104 obtains information relating to horizontal and angular positions of the electric component 90 as held by the suction nozzle 92. The substrate imaging device 62 is fixedly disposed, so that the circuit substrate 52 is moved such that a desired area of the component-mounting surface of the circuit substrate 52 is aligned with the substrate imaging device 62, when an image of this area is taken by the substrate imaging device 62. Image data obtained by the substrate imaging device 62 are processed by an image-data processing device in the form of a substrate-image-data processing unit 106 (shown in FIG. 4), which is also incorporated in the first mounting-device control device 64. The substrate-image-data processing unit 106 is operable to obtain substrate-position information indicating the position of the specific circuit substrate 52, substrate identifying information identifying the circuit substrate 52, and various kinds of specific information indicating specific characteristics of the specific circuit substrate 52, as described below in detail.

Figure 4:
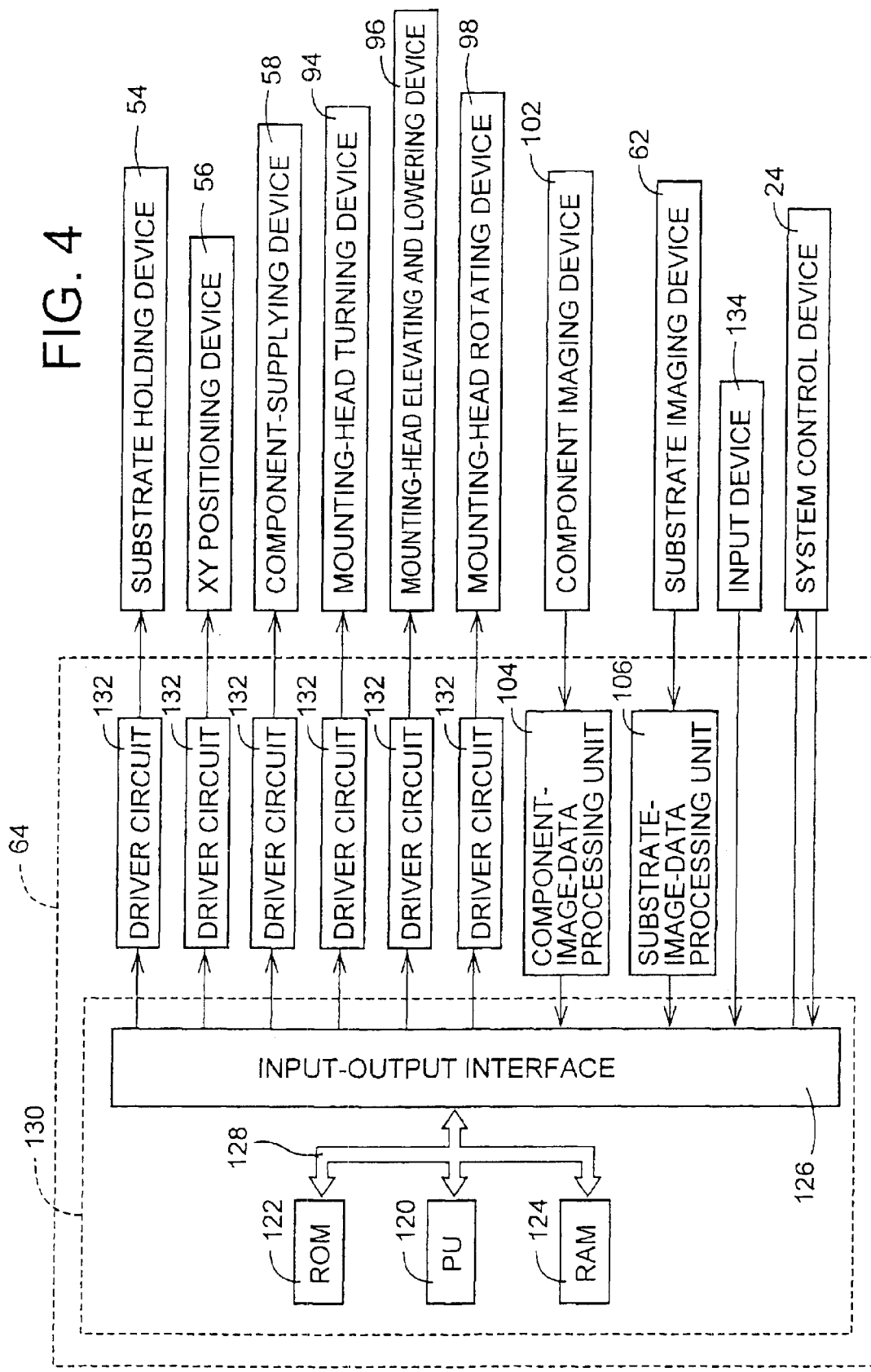
FIG. 4 is a block diagram showing a first-mounting-device control device for controlling the first mounting device, and some elements of the first mounting device which relate to the present invention.

Referring to the block diagram of FIG. 4, there are shown the first mounting-device control device 64, and some elements of the first mounting device 12 which relate to the present invention. The first mounting-device control device 64 is constituted principally by a computer 130 incorporating a processing unit (PU) 120, a read-only memory (ROM) 122, a random-access memory (RAM) 124, an input-output interface 126, and a bus 128 interconnecting these elements. To the input-output interface 126, there are connected through driver circuits 132 (within the first mounting-device control device 64) to the substrate holding device 54, the XY positioning device 56, the component-supplying device 58, the mounting-head turning device 94, the mounting-head elevating and lowering device 96 and the mounting-head rotating device 98. To the input-output interface 126, there are also connected the component imaging device 102 through the component-image-data processing unit 104, and the substrate imaging device 62 through the substrate-image-data processing unit 106, so that the computer 130 receive the information relating to the horizontal and angular positions of the electric components 90, the substrate-position information and the various kinds of specific information of the specific circuit substrates 52. Also connected to the input-output interface 126 are an input device 134 such as a keyboard for controlling the first mounting device 12, and the system control device 24 for controlling the electric-circuit fabricating system. The ROM 122 stores basic control programs for controlling the first mounting device 12, and the RAM 124 stores electric-component mounting programs corresponding to respective different kinds of the circuit substrates 52, and the above-indicated information relating to the horizontal and angular positions of the electric components 90, substrate-position information and various kinds of specific information relating to the circuit substrates 52. The manner of operation of the first mounting device 12 is substantially identical with that of an electric-component mounting device as disclosed in JP-B2-8-21791.

<Arrangement of Second Mounting Device>

Figure 5:
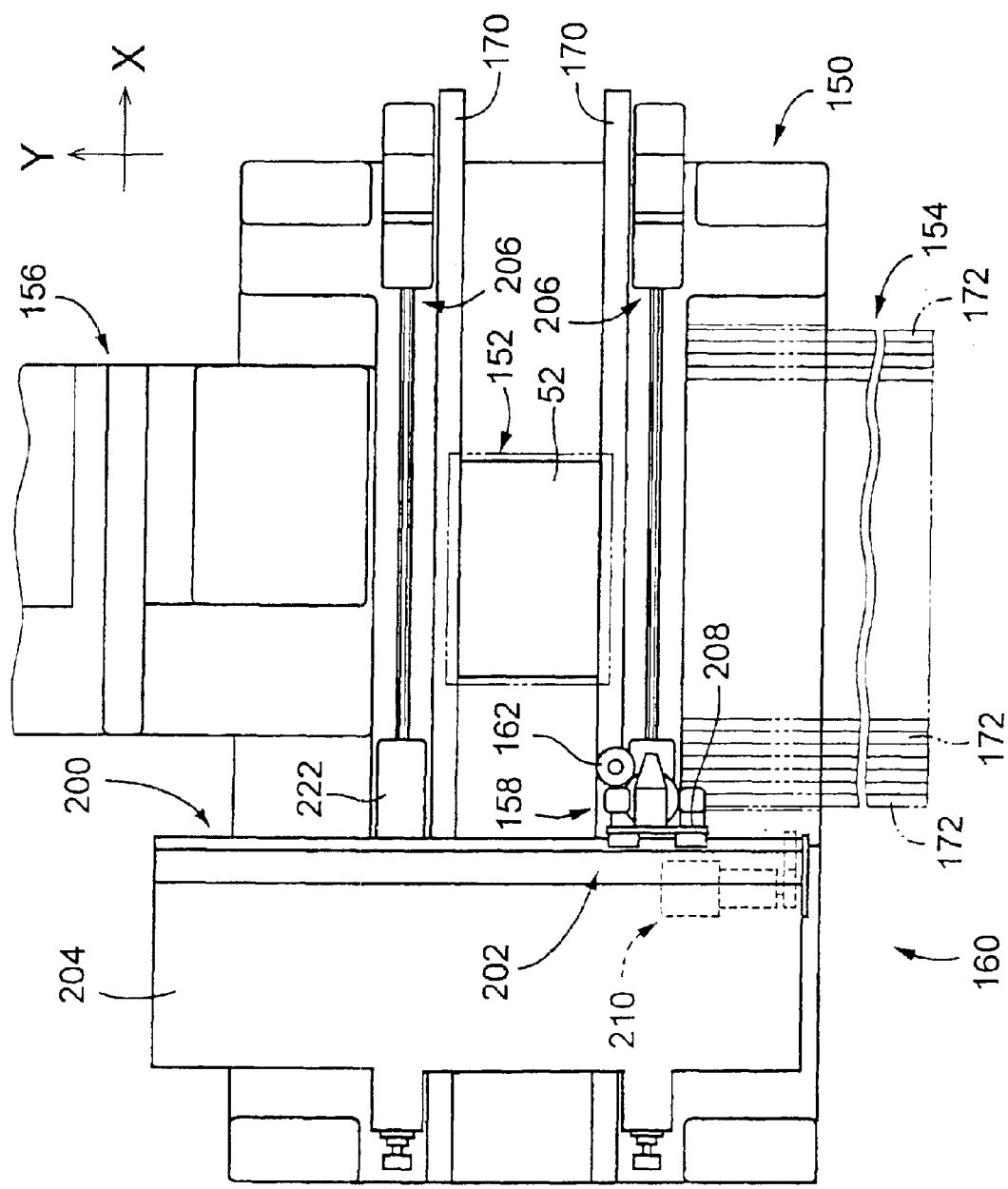
FIG. 5 is a plan view schematically showing a second mounting device in the form of an electric-component mounting device of XY robot type.
Figure 6:
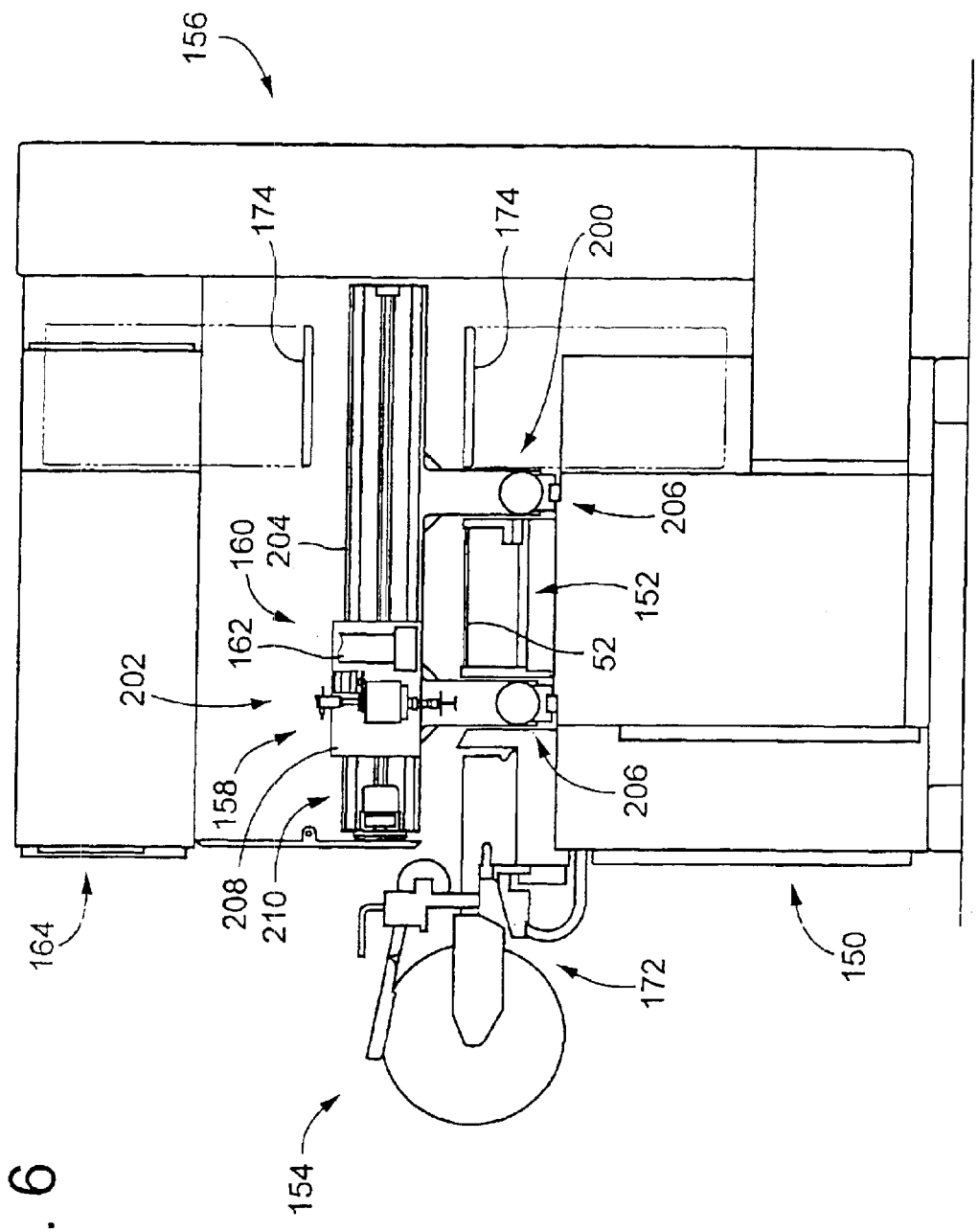
FIG. 6 is a side elevational view schematically showing an entirety of the second mounting device.
Figure 7:
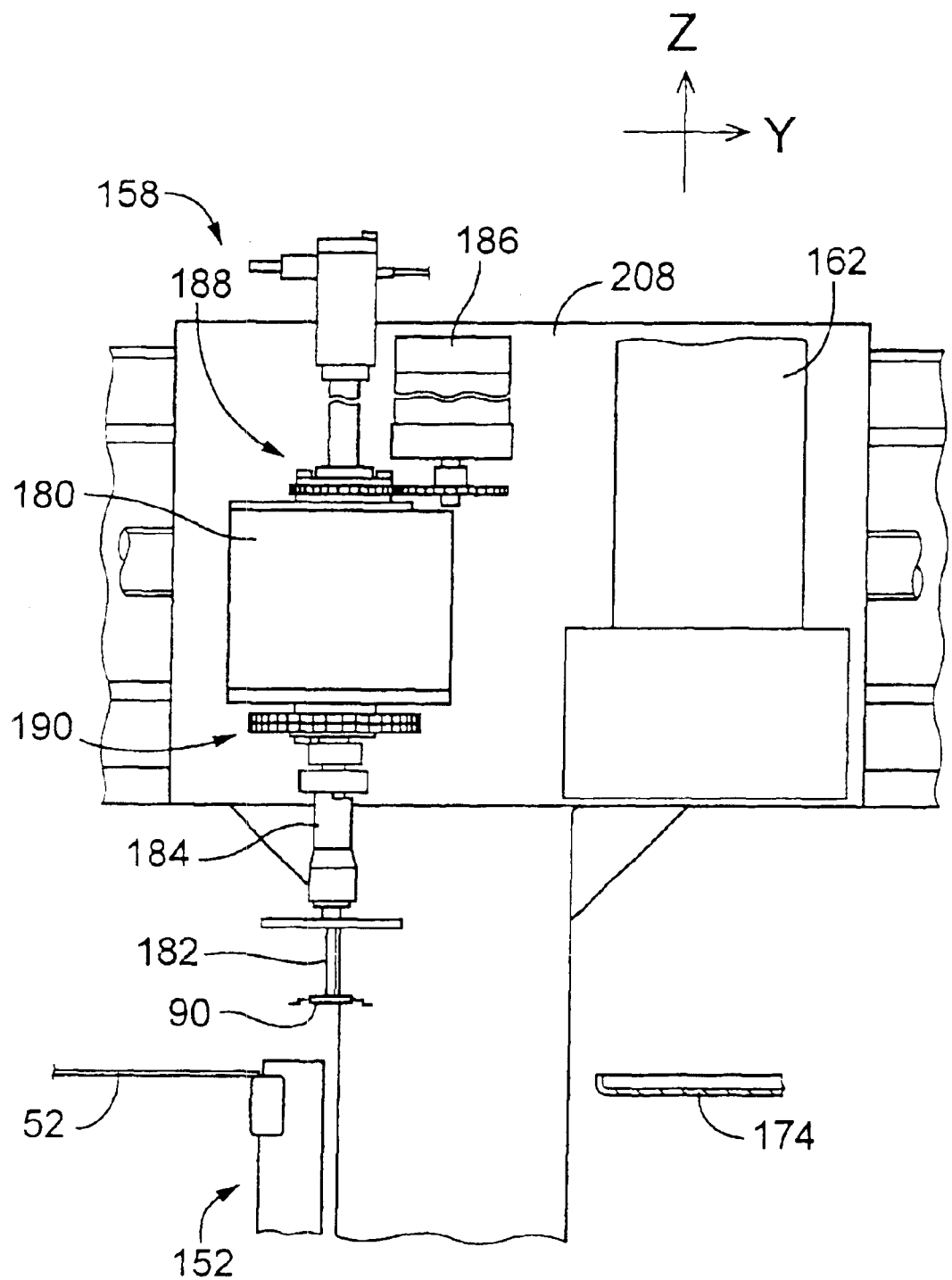
FIG. 7 is a fragmentary front elevational view showing a single-head type mounting unit of the second mounting device, and its vicinity.

Referring next to the plan view of FIG. 5, the side elevational view of FIG. 6 and the fragmentary elevational view of FIG. 7, there are shown the second mounting device 14 and a single-head type mounting unit 158 of the second mounting device 14. The second mounting device 14 includes: a main body 150; a substrate holding device 152 disposed on the main body 150 and arranged to hold the circuit substrate 52; a feeder type component-supplying device 154 disposed on a front side (lower side as seen in FIG. 5) of the substrate holding device 152; a tray type component-supplying device 156 disposed on a rear side (upper side as seen in FIG. 5) of the substrate holding device 152; a single-head type mounting unit 158 movable in a plane which is parallel to the circuit substrate 52 and which is located above the two component-supplying devices 154, 156 and the substrate holding device 152; an XY robot 160 disposed on the main body 150 and operable to move the mounting unit 158 in the X-axis and Y-axis directions; a substrate imaging device 162 which is movable with the mounting unit 158 by the XY robot 160 and which includes an imaging device in the form of a CCD camera operable to take images of desired areas of the component-mounting surface of the circuit substrate 52; and a second mounting-device control device 164 provided to control the above-indicated elements of the second mounting device 14. The second mounting device 14 is constructed as disclosed in Japanese Patent No. 2,824,378, and the tray type component-supplying device 156 is constructed as disclosed in JP-B2-2-57719, while the single-head type mounting unit 158 is constructed as disclosed in Japanese Patent No. 3,093,339. Since the understanding of the specific constructions of these devices 14, 156, 158 is not necessary to understand the principle of this invention, these devices will be described only briefly.

The substrate holding device 152 is provided to receive the circuit substrate 52 transferred by substrate conveyor belts 170, and hold the circuit substrate 52 at a position almost aligned with a nominal working position. The feeder type component-supplying device 154 includes a component-supply table, and a plurality of tape feeders 172 which are arranged on the component-supply table in the X-axis direction (in the right and left direction as seen in FIG. 5). Each of the tape feeders 172 is arranged to feed a carrier tape accommodating a succession of electric components 90, so that the electric components 90 are fed one after another to a component-supply portion of the feeder 172. The tray type component-supplying device 156 includes a plurality of trays 174 which are superposed on each other in a stack and which accommodate the electric components 90. The trays 174 are movable to permit the electric components 90 to be received by the single-head type mounting unit 158.

The single-head type mounting unit 158 includes a main body 180, and a mounting head 184 which has a suction nozzle 182 at its lower end to hold the electric component 90 by suction. The mounting head 184 is held by the main body 180 such that the mounting head 184 is rotatable and vertically movable relative to the main body 180. The mounting unit 158 further includes a mounting-head elevating and lowering device 188 which includes a drive source in the form of an electric motor 186 and which is arranged to elevate and lower the mounting head 184. The mounting unit 158 further includes a mounting-head rotating device 190 which includes a drive source in the form of an electric motor (not shown) and which is arranged to rotate the mounting head 184 about its axis. When the mounting head 184 is located at the component-supplying and component-mounting positions, the mounting head 184 is vertically moved by the mounting-head elevating and lowering device 188, to hold the electric component 90 by suction and transfer the electric component 90 onto the component-mounting surface of the circuit substrate 52. When the electric component 90 as held by the suction nozzle 182 of the mounting head 184 has an angular positioning error, the mounting head 184 is rotated about its axis by the mounting-head rotating device 190, to eliminate the angular positioning error of the electric component 90. The suction nozzle 182 can be communicated with a negative pressure source (not shown), so that the suction nozzle 182 is operable to hold the electric component 90 by suction under a negative pressure.

The XY robot 160 includes an X-robot device 200 and a Y-robot-device 202. The X-robot device 200 is disposed on the main body 150, and includes an X-axis slide 204 and an X-axis-slide moving device 206 operable to move the X-axis slide 204 in the X-axis direction, while the Y-robot device 202 is disposed on the X-axis slide 204, and includes a Y-axis slide 208 and a Y-axis-slide moving device 210 operable to move the Y-axis slide 208 on the X-axis slide 204 in the Y-axis direction. The X-robot device 200 and the Y-robot device 202 include respective drive sources in the form of servomotors, and ballscrew-ballnut mechanisms operated by the servomotors to move the X-axis and Y-axis slides 204, 208. The single-head type mounting unit 158 is mounted on the Y-axis slide 208.

On the X-axis slide 204, there is mounted a component imaging device 220 (shown in FIG. 8) which includes an imaging device in the form of a CCD camera, and a light guiding device in the form of a reflecting mirror 222 shown in FIG. 5. When the component imaging device 220 passes a point right above the reflecting mirror 222, during a movement of the X-axis slide 204, the CCD camera is operated to take an image of the electric component 90 as held by the mounting head 184. Image data indicative of the image of the electric component 90 are processed by an image-data processing device in the form of a component-image-data processing unit 224 (shown in FIG. 8), which is incorporated in the second mounting-device control device 164. The component-image-data processing unit 224 obtains information relating to horizontal and angular positions of the electric component 90. The substrate imaging device 162 is disposed on the Y-axis slide 208, as shown in FIG. 7, and is moved by the XY robot 160 in the XY plane, to take images of desired areas of the component-mounting surface of the circuit substrate 52. Image data obtained by the substrate imaging device 162 are processed by an image-data processing device in the form of a substrate-image-data processing unit 226 (shown in FIG. 8), which is also incorporated in the second mounting-device control device 164. The substrate-image-data processing unit 226 obtain substrate-position information and various kinds of specific information of the specific circuit substrates 52.

Figure 8:
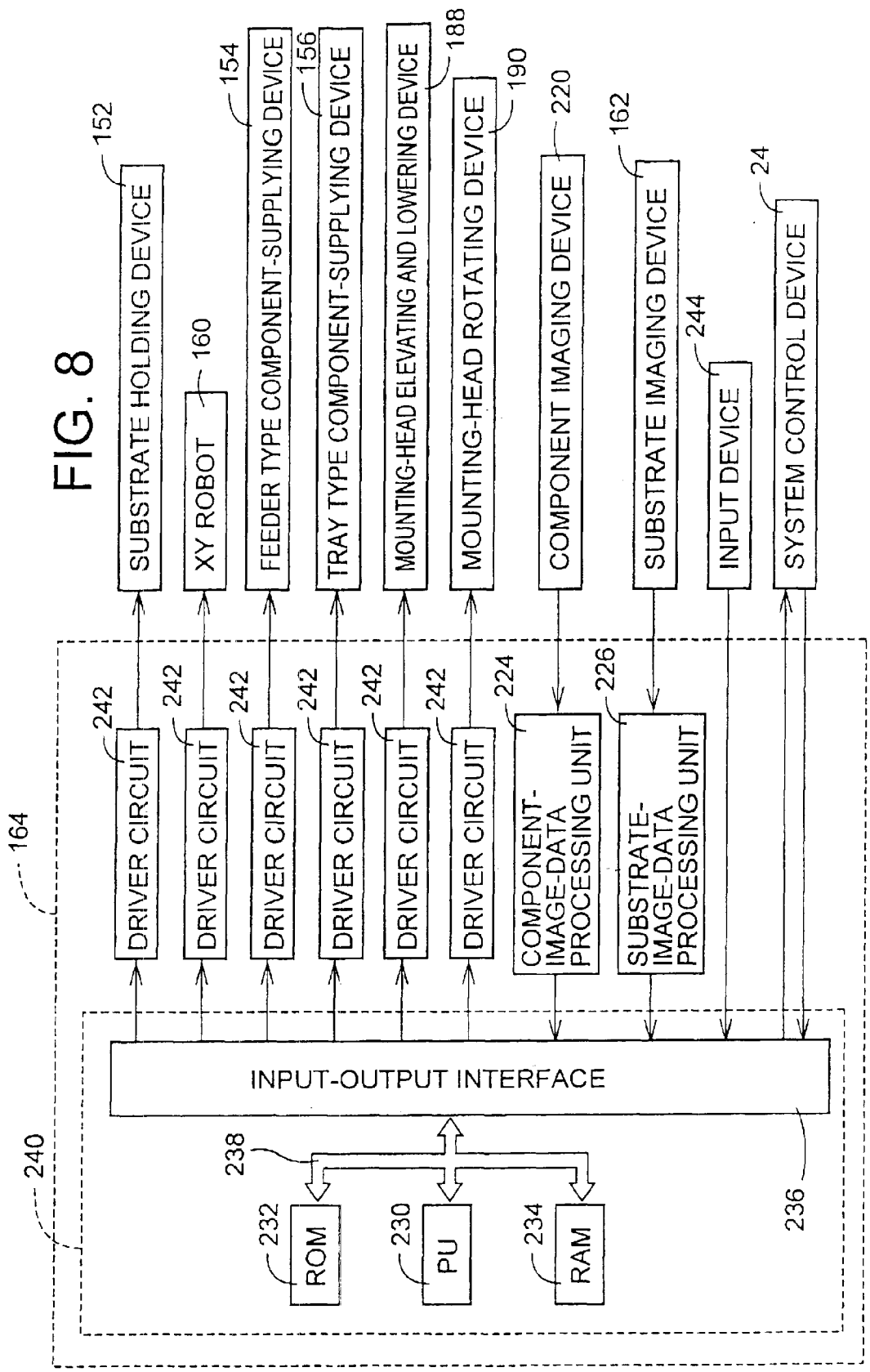
FIG. 8 is a block diagram showing a second-mounting-device control device for controlling the second mounting device, and some elements of the second mounting device which relate to the present invention.

The block diagram of FIG. 8 shows the second mounting-device control device 164 and some elements of the second mounting device 14 which relate to the present invention. The second mounting-device control device 164 is constituted principally by a computer 240 incorporating a processing unit (PU) 230, a read-only memory (ROM) 232, a random-access memory (RAM) 234, an input-output interface 236, and a bus 238 interconnecting these elements. To the input-output interface 236, there are connected through driver circuits 242 (within the second mounting-device control device 164) to the substrate holding device 152, the XY robot 160, the feeder type component-supplying device 154, the tray type component-supplying device 156, the mounting-head elevating and lowering device 188 and the mounting-head rotating device 190. To the input-output interface 236, there are also connected the component imaging device 220 through the component-image-data processing unit 224, and the substrate imaging device 162 through the substrate-image-data processing unit 226, so that the computer 240 receive the information relating to the horizontal and angular positions of the electric components 90, the substrate-position information and the specific information of the circuit substrates 52. Also connected to the input-output interface 236 are an input device 244 such as a keyboard for controlling the second mounting device 14, and the system control device 24 for controlling the electric-circuit fabricating system. The ROM 232 stores basic control programs for controlling the second mounting device 14, and the RAM 234 stores electric-component mounting programs corresponding to different kinds of the circuit substrates 52, and the above-indicated information relating to the horizontal and angular positions of the electric components 90, substrate-position information and specific information relating to the circuit substrates 52. The manner of operation of the second mounting device 14 is substantially identical with those of electric-component mounting devices as disclosed in Japanese Patent No. 2,824,378.

<Circuit Substrate>

Figure 9:
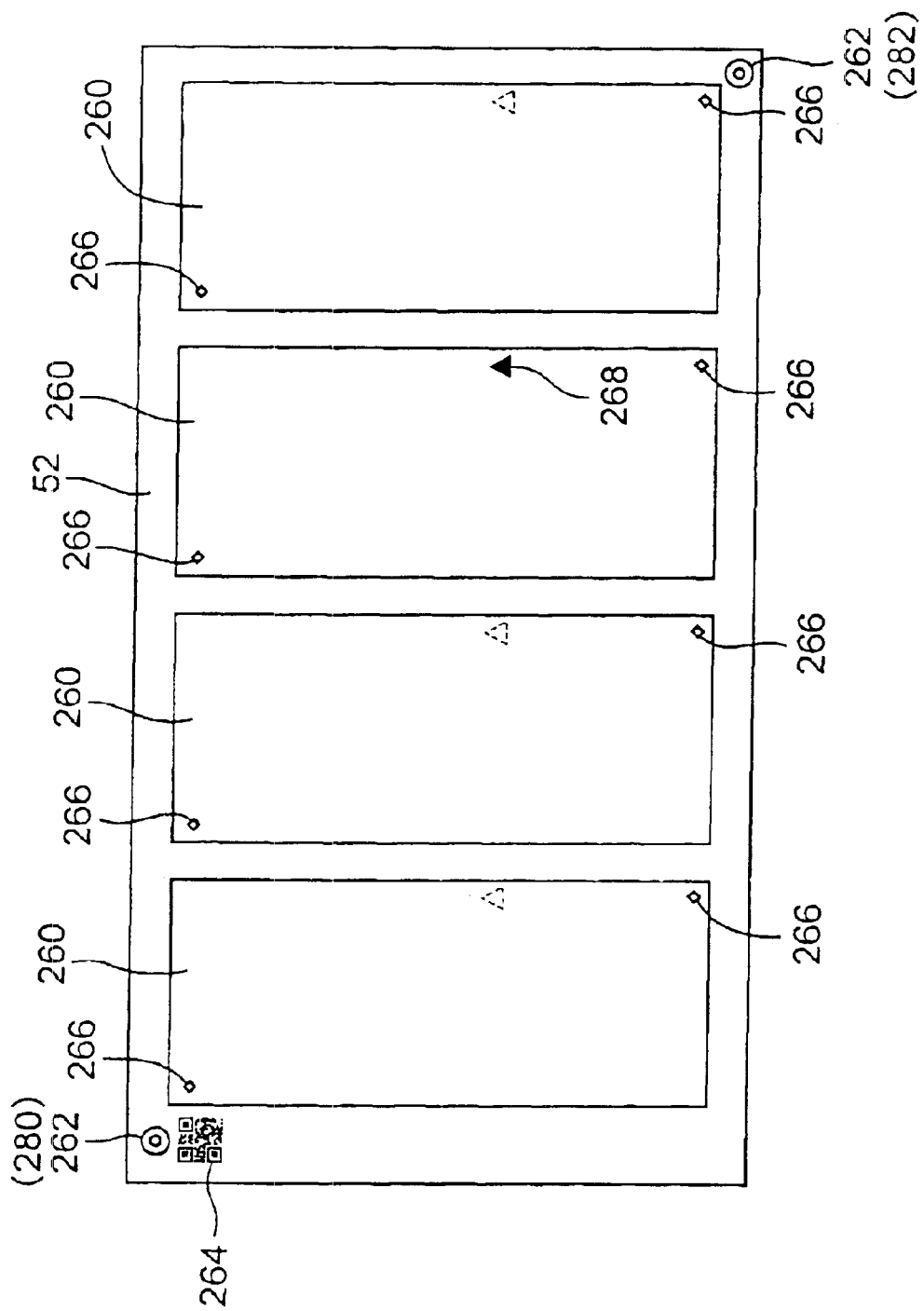
FIG. 9 is a view illustrating a circuit substrate on which working operations are performed.

As shown in FIG. 9, the circuit substrate 52 on which the mounting operations are performed by the first and second mounting devices 12, 14 in the present embodiment has four rectangular working areas 260 in which the electric components 90 are to be mounted. These four working areas are arranged in its longitudinal direction of the substrate 52. After all operations of the present electric-circuit fabricating system have been performed on the substrate 52, the substrate 52 is cut or otherwise separated into four boards which correspond to the respective four working areas 260 and which have respective four electric circuits. In the present embodiment, the four working areas 260 have the same wiring pattern. Accordingly, the same component-mounting program may be used for all of the four working areas 260, in the first and second working processes, which will be described.

The rectangular circuit substrate 52 has two substrate-position fiducial marks 262, which are located at respective two corner portions of a rectangle of the circuit substrate 52 that are opposed to each other in one diagonal direction of the rectangle. The two corner portions at which the two substrate-position fiducial marks 262 are located serve as substrate-fiducial-position indicating portions, which are provided with substrate-fiducial-position indicators in the form of the fiducial marks 262, which provide substrate-position information indicative of the position of the circuit substrate 52 as held by the substrate holding device 54 or 152 in the first and second working processes. Described in detail, images of the two substrate-position fiducial marks 262 are taken by the substrate imaging devices 62, 162 while the circuit substrate 52 is held by the substrate holding device 54, 152. Image data indicative of these images are processed by image-data processing devices in the form of the substrate-image-data processing units 106, 226, to detect horizontal positioning errors of the circuit substrate 52 in the X-axis and Y-axis directions in the XY plane parallel to the component-mounting surface of the circuit substrate 52, and an angular positioning error of the circuit substrate 52 about an axis perpendicular to the component-mounting surface (in a θ-axis direction). When the electric components 90 are mounted on the circuit substrate 52, the component-mounting spots on the component-mounting surface are adjusted on the basis of these horizontal and angular positioning errors (positioning errors in the X-axis, Y-axis and θ-axis directions) of the circuit substrate 52, that is, for compensation for these positioning errors.

Adjacent to one of the two substrate-position fiducial marks 262, there is provided a substrate identifier in the form of a substrate ID mark 264 which identifies the circuit substrate 52. A portion of the circuit substrate 52 at which the substrate ID mark 264 is located serve as a substrate identifier portion provided with the substrate identifier, which provides substrate identifying information identifying the circuit substrate 52. While the circuit substrate 52 is held by the substrate holding device 54, 152, an image of the substrate ID mark 264 is taken by the substrate imaging devices 62, 162, and image data indicative of the image are processed by the substrate-image-data processing units 106, 226, to identify the specific circuit substrate 52. The substrate ID mark 264 is a two-dimensional bar code disposed within a comparatively small surface area near one of the two substrate-position fiducial marks 262, so that the image of the substrate ID mark 264 can be located within the imaging area (field of vision) of the substrate imaging device 62, 162 (more precisely, its CCD camera) when the image of the above-indicated substrate-position fiducial mark 262 is taken by the substrate imaging device 62, 162. Thus, the images of this substrate-position fiducial mark 262 and the substrate ID mark 264 can be taken at one time by the substrate imaging device 62, 162, without having to move the substrate imaging device 62, 162 relative to the circuit substrate 52.

Each of the four rectangular working areas 260 on the component-mounting surface of the circuit substrate 52 is defined by area-fiducial-position indicators in the form of two area-position fiducial marks 266, which are located to specify respective two corner portions of a rectangle of each working area 260. These two area-position fiducial marks 266 are precisely located at predetermined positions relative to the wiring pattern printed in the corresponding working area 260, and function as indicators which provide area-position specifying information indicative of the position of each working area 260 relative to the circuit substrate 52. This area-position specifying information provided by the area-position fiducial marks 266 is a kind of specific information on the circuit substrate 52. The two corner portions of each working area 260 at which the two area-position fiducial marks 266 are located serve as specific-information providing portions in which the specific information in the form of the area-position specifying information is provided. It will be understood that the substrate-position fiducial marks 262 and the area-position fiducial marks 266 cooperate to permit accurate detection of the position of each working area 260 relative to the circuit substrate 52, or the position of each working area 260 within the circuit substrate 52. Thus, the substrate-position information provided by the substrate-position fiducial mark 262 and the area-position specifying information provided by the area-position fiducial marks 266 cooperate to define a positional relationship between each working area 260 and the circuit substrate 52 (substrate-position fiducial marks 262). Like the substrate-position fiducial marks 262, the area-position fiducial marks 266 are imaged by the substrate imaging devices 62, 162. The obtained image data are processed by the substrate-image-data processing units 106, 226, to detect and obtain the area-position specifying information indicative of the positions of each working area 260 in the X-axis, Y-axis and θ-axis directions relative to the substrate-position fiducial marks 262.

A mounting-inhibit mark 268 may be provided within each of a selected one or ones of the four working areas 260 of the circuit substrate 52. In the example of FIG. 9, the mounting-inhibit mark 268 is provided in the second working area 260 as counted from the rightmost working area 260. The mounting-inhibit mark 268 serves as an indicator providing area-working inhibit/non-inhibit information which indicates whether a working operation in the working area 260 is inhibited or not, or possible or not, in the first and second working processes. In the present embodiment, the mounting-inhibit mark 268 serves as an indicator indicating whether an operation to mount the electric components 90 in the corresponding working area 260 is inhibited. For example, the mounting-inhibit mark 268 is provided in each working area 260 in which the printed wiring pattern is defective. The area-working inhibit/non-inhibit information provided by the mounting-inhibit mark 268 is also a kind of specific information relating to the specific circuit substrate 52, and the mark 268 serves as one of the indicators providing various kinds of specific information of the circuit substrate 52. All of the four working areas 260 have the same predetermined positions at which the mounting-inhibit mark 268 is located, if this mark 268 is provided. That is, if the mounting-inhibit marks 268 are provided in two or more working areas 260, these marks 268 are located at the same position relative to the area-position fiducial marks 266. The working areas 260 in which the mounting operations are permitted are not provided with the mounting-inhibit marks 268. In FIG. 9, the mounting operations are permitted in the three working areas 260 in which the positions for the mounting-inhibit mark 268 are indicated by triangles of broken line. Thus, portions of each working area 260 at which the mounting-inhibit mark 268 is located when provided serve as specific-information providing portions which provide the specific information in the form of the area-working inhibit/non-inhibit information. Like the substrate-position fiducial marks 262 and the area-position fiducial marks 266, the mounting-inhibit mark 268 is imaged by the substrate imaging devices 62, 162, and the obtained image data are processed by the substrate-image-data processing units 106, 226, to obtain the area-working inhibit/non-inhibit information.

<Operations of First and Second Mounting Devices in First and Second Working Processes>

The first working process is performed by the first mounting device 12, and the second working process is performed by the second mounting device 14. The first and second mounting devices 12, 14 are controlled by the respective first and second mounting-device control devices 64, 164, according to the basic control programs stored in the ROMs 122, 232, and the electric-component mounting programs stored in the RAMs 124, 234. The electric-component mounting programs include data representative of the electric components 90, the corresponding component-mounting spots on the circuit board 52, and the order in which the electric components 90 are mounted at the respective component-mounting spots. The RAMs 124, 234 also store position data indicative of the positions of the above-described substrate-position fiducial marks 262, substrate ID mark 264, area-position fiducial marks 266 and mounting-inhibit marks 268. The electric-component mounting programs also include positioning data for positioning the substrate imaging devices 62, 162 and the circuit substrate 52 relative to each other, on the basis of the above-indicated position data, to take the images of those marks 262, 264, 266, 268.

Figure 10:
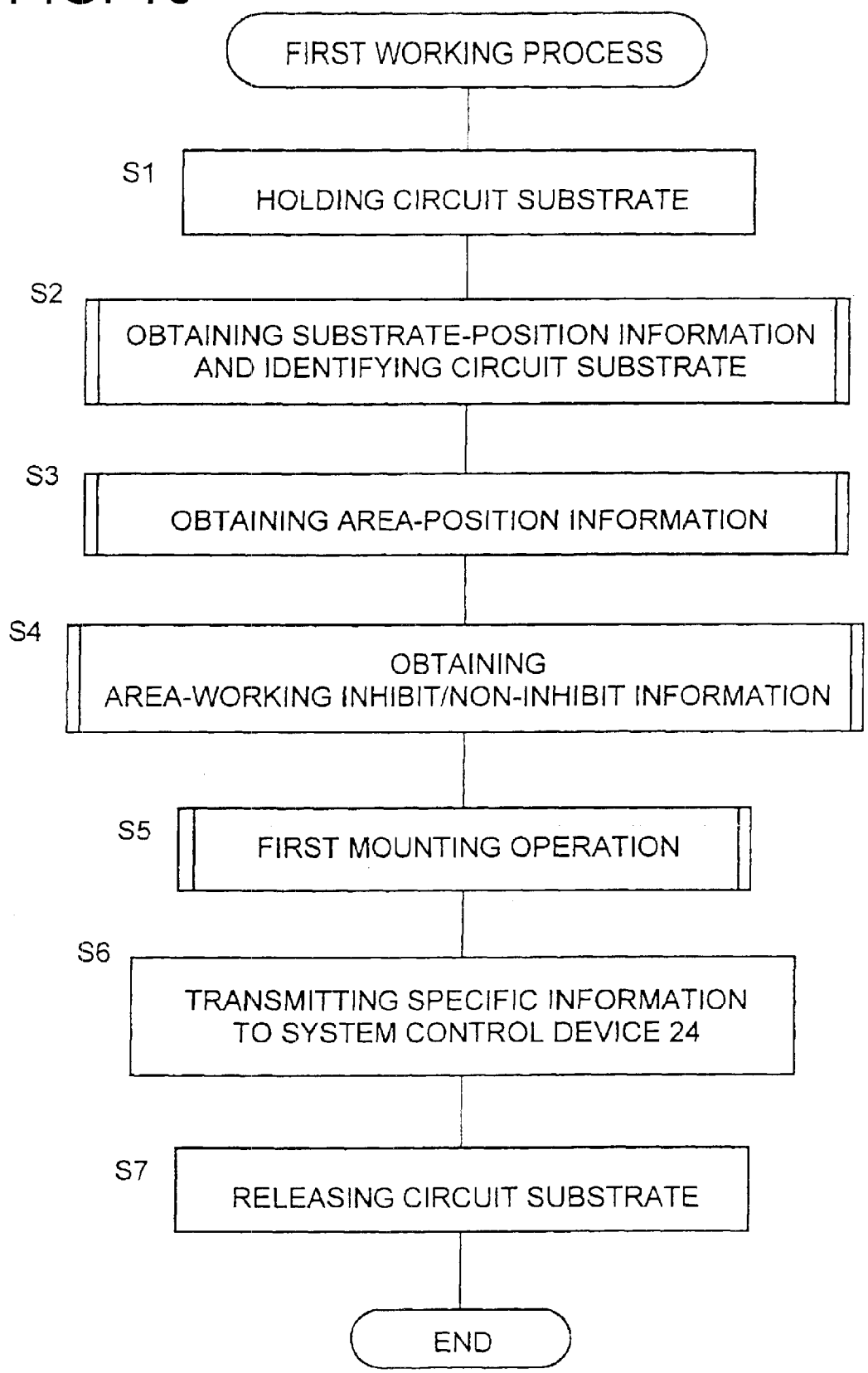
FIG. 10 is a flow chart illustrating a first working process performed by the first mounting device.

Referring to the flow chart of FIG. 10, there will be described the first working process performed by the first mounting device 12. The first working process is initiated with step S1 in which the circuit substrate 52 transferred from the upstream substrate transferring device 18 is held by the substrate holding device 54, at a position almost aligned with the nominal working position. Thus, the step S1 is a substrate holding step of holding the circuit substrate 52. Then, the control flow goes to step S2 to obtain the substrate-position information and substrate identifying information. That is, the step S2 is a combination of a step of identifying the circuit substrate and a step of obtaining the substrate-position information, in the first working process.

Figure 11:
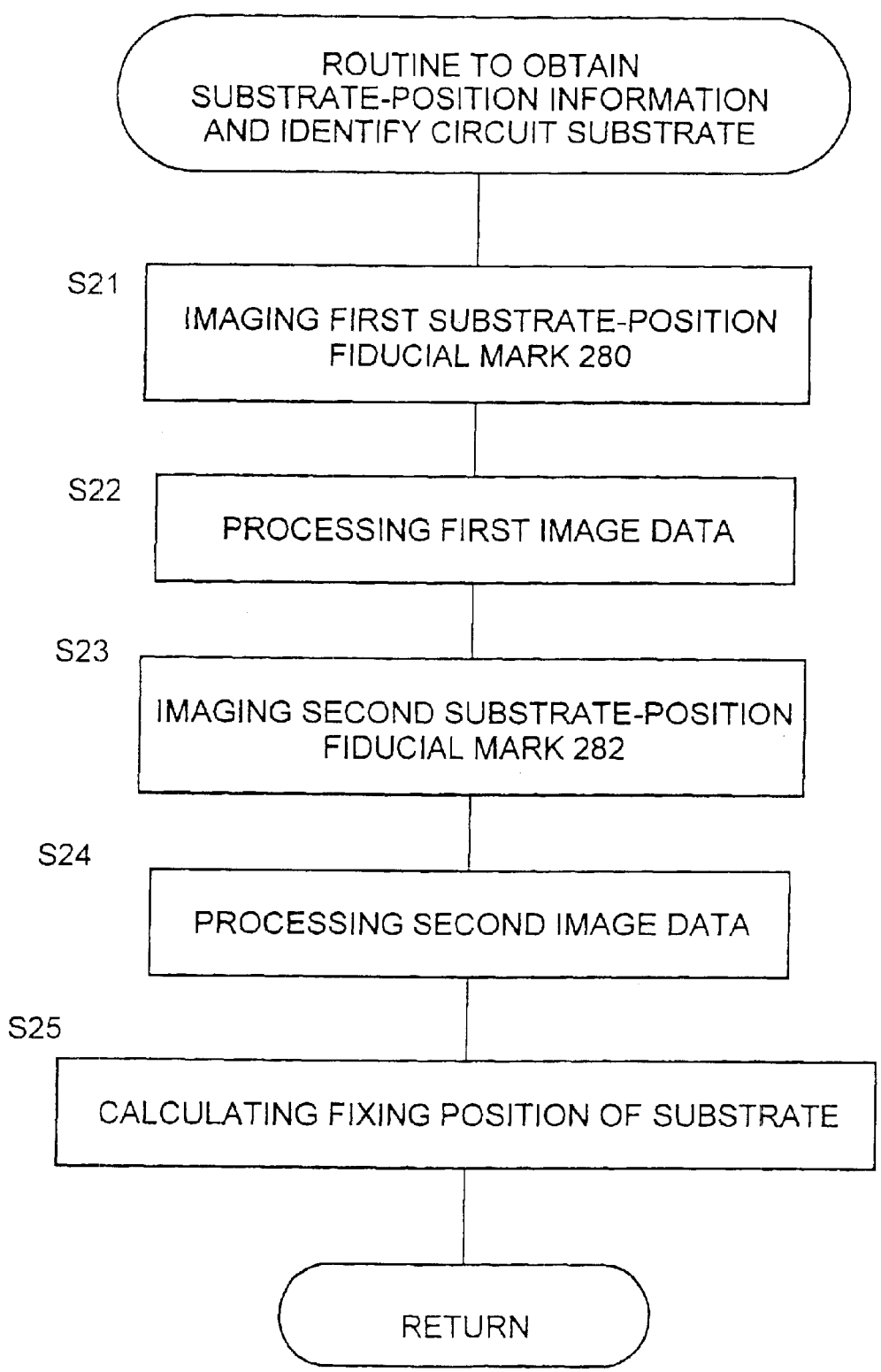
FIG. 11 is a flow chart illustrating a routine executed in the first working process, to obtain substrate-position information and identify the circuit substrate.

The flow chart of FIG. 11 illustrates a routine executed in step S2 to obtain the substrate-position information and to identify the circuit substrate 52. This routine is initiated with step S21 in which the substrate holding device 54 holding the circuit substrate 52 is moved by the XY positioning device 56, so that one of the two substrate-position fiducial marks 262 is located right below the substrate imaging device 62. In the present embodiment, the substrate-position fiducial mark 262 located at the upper left corner of the rectangular circuit substrate 52 is located right below the substrate imaging device 62. This fiducial mark 262 will be referred to as a first substrate-position fiducial mark 280, while the other fiducial mark 262 will be referred to as a second substrate-position fiducial mark 282. Described more precisely, the circuit substrate 52 is moved relative to the substrate imaging device 62, to a position at which both the first substrate-position fiducial mark 280 and the substrate ID mark 264 located adjacent the fiducial mark 280 are located within the imaging area of the substrate imaging device 62. At this position, these two marks 280, 264 and the surrounding area of the component-mounting surface of the circuit substrate 52 are imaged by the substrate imaging device 62, to obtain first image data. Step S21 is followed by step S22 in which the obtained first image data are processed to calculate the X-axis and Y-axis positions of the first substrate-position fiducial mark 280 in the machine coordinate system set for the first mounting device 12, and to identify the circuit substrate 52 held by the substrate 52.

Then, the control flow goes to step S23 in which the circuit substrate 52 is moved to a position at which the second substrate-position fiducial mark 282 is located right below the substrate imaging device 62. At this position, the second fiducial mark 282 and the surrounding area of the component-mounting surface are imaged by the substrate imaging device 62, to obtain second image data. Step S23 is followed by step S24 in which the obtained second image are processed to calculate the X-axis and Y-axis positions of the second substrate-position fiducial mark 282 in the machine coordinate system. Then, the control flow goes to step S25 in which the substrate-position information indicative of the position of the circuit substrate 52 as held by the substrate holding device 54 is obtained on the basis of the position data of the first and second substrate-position fiducial marks 280, 282 obtained in step S22 and S24. Described more specifically, the substrate-position information include errors of positioning of the circuit substrate 52 with respect to the nominal working position, namely, horizontal positioning errors $\Delta Xa1$ and $\Delta Ya1$ in the respective X-axis and Y-axis directions, and an angular positioning error $\Delta \theta a1$ in the $\theta$-axis direction (angle of one side of the circuit substrate 52 with respect to the X or Y axis of the XY coordinate system). These positioning errors are stored in the RAM 124. On the basis of the positioning errors, the first mounting-device control device 64 establishes a working coordinate system in which the movements of the movable members such as the XY positioning device 56 to mount the electric components 90 on the circuit substrate 52 are defined and commanded. The routine of FIG. 11 can be executed with high efficiency, due to the simultaneous imaging of the first substrate-position fiducial mark 280 and the substrate ID mark 264 in step S21.

Figure 12:
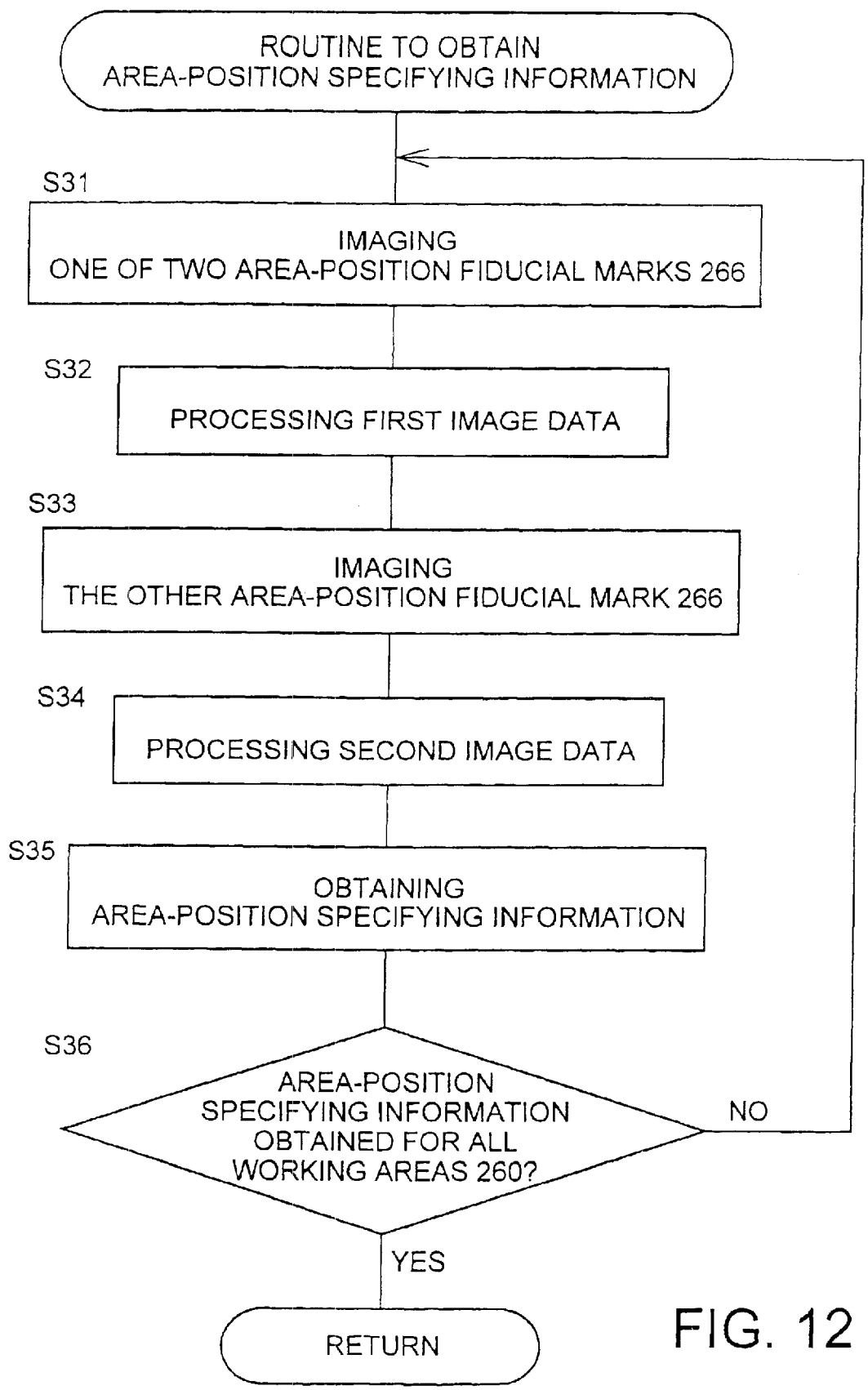
FIG. 12 is a flow chart illustrating a routine executed in the first working process, to obtain substrate-section-position specifying information.

After the substrate-position information and the substrate identifying information have been obtained in step S2, the control flow goes to step S3 to obtain the area-position specifying information indicative of the positions of the working areas 260. This step S3 constitutes a part of a step of obtaining various kinds of specific information on the circuit substrate 52. The flow chart of FIG. 12 illustrates a routine executed in step S3 to obtain the area-position specifying information, which is obtained for each of the four working areas 260 one after another, in the order in which the four working areas 260 are arranged in the right direction as seen in FIG. 9. In the following description, the four working areas 260 arranged in the right direction are referred to as first, second, third and fourth working areas 260.

In the first cycle of execution of the routine of FIG. 12, the area-position specifying information is obtained for the first working area 260. The routine is initiated with step S31 in which the circuit substrate 52 is moved by the XY positioning device 56, so that one of the two area-position fiducial marks 266, that is, the upper left area-position fiducial mark 266 as seen in FIG. 9 is located right below the substrate imaging device 62. At this position, the upper left area-position fiducial mark 266 and the surrounding area are imaged by the substrate imaging device 62, to obtain first image data. Then, the control flow goes to step S32 in which the thus obtained first image data are processed to obtain the X-axis and Y-axis positions of the upper left area-position fiducial mark 266 in the working coordinate system indicated above. Step S32 is followed by step S33 in which the circuit substrate 52 is moved so that the other area-position fiducial mark 266, that is, the lower right area-position fiducial mark 266 is located right below the substrate imaging device 62. At this position, the lower right area-position fiducial mark 266 and the surrounding area are imaged to obtain second image data. Then, the control flow goes to step S34 in which the obtained second image data are processed to obtain the X-axis and Y-axis positions of the lower right area-position fiducial mark 266.

Then, the control flow goes to step S35 in which the information specifying the position of the first working area 260 in the working coordinate system is obtained on the basis of the position data of the two area-position fiducial marks 266. This area-position specifying information includes errors of positioning of the first working area 260 with respect to the nominal position within the circuit substrate 52. For example, these positioning errors of the first working area 260 are represented by offset distances $\Delta Xb1$ and $\Delta Yb1$ of the zero point of the first working area 260 with respect to the zero point of the working coordinate system in the respective X-axis and Y-axis directions, and an angle $\Delta \theta b1$ in the $\theta$-axis direction of the working area 260 (angle of one side of the working area 260 with respect to the X or Y axis of the XY coordinate system). These offset distances and angle of the first working area 260 are stored in the RAM 124. Step S35 is followed by step S36 to determine whether the area-position specifying information has been obtained for all of the four working areas 260. Steps S31–S35 are repeatedly implemented until an affirmative decision (YES is obtained in step S36, that is, until sets of information specifying the positions of the four working areas 260 have been obtained). When the affirmative decision is obtained in step S36, the execution of the routine of FIG. 12 is terminated.

Figure 13:
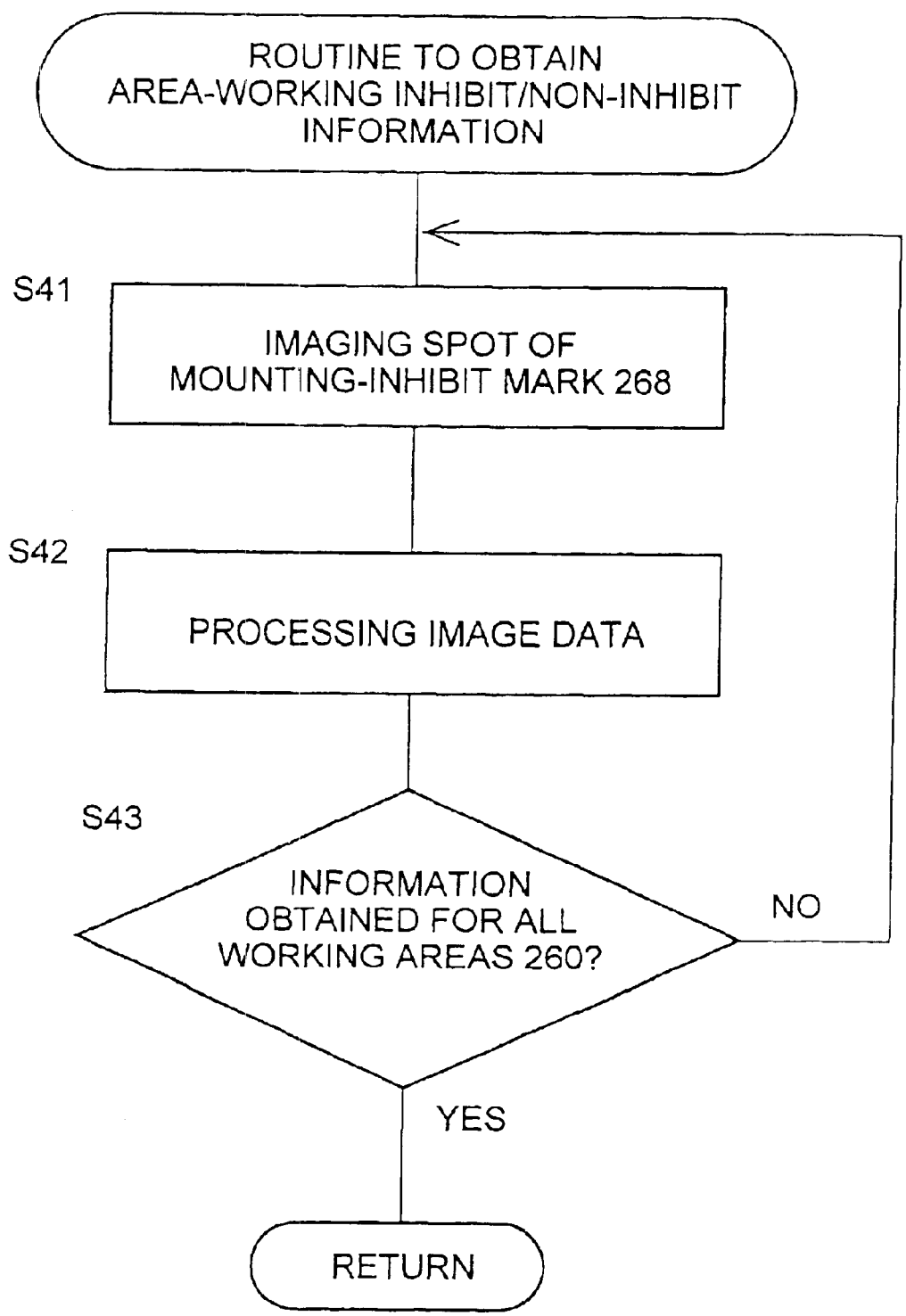
FIG. 13 is a flow chart illustrating a routine executed in the first working process, to obtain information for determining whether a working operation on each section of the circuit substrate is possible or not.

After the areas-position specifying information has been obtained in step S3, the control flow goes to step S4 to obtain the area-working inhibit/non-inhibit information. In this embodiment, this area-working non-inhibit information indicates whether the operation to mount the electric components 90 should be performed in each of the working areas 260. This step 54 of obtaining the area-working inhibit/non-inhibit information also constitutes a part of the step of obtaining the various kinds of specific information on the circuit substrate 52. The flow chart of FIG. 13 illustrates a routine executed in step S4 to obtain the area-working inhibit/non-inhibit information. Like step S3, step S4 is implemented for the first through fourth working areas 260, in this order of description.

The routine of FIG. 13 is initiated with step S41 in which the circuit substrate 52 is moved by the XY positioning device 56, to a position at which the position of the mounting-inhibit mark 268 is located right below the substrate imaging device 62. The mounting-inhibit mark 268 may or may not actually be provided at this position. Then, the area of the working area 260 including or surrounding this position is imaged by the substrate imaging device 62. Step S41 is followed by step S42 in which image data obtained in step S42 are processed to obtain the area-working inhibit/non-inhibit information, that is, to determine whether the mounting-inhibit mark 268 is provided on the working area 260 under examination. This information is stored in the RAM 124. For example, an INHIBIT flag provided in the RAM 124 is set to "1" when the mark 268 has been detected, or to "0" when the mark 268 has not been detected. Step S42 is followed by step S43 to determine whether the area-working inhibit/non-inhibit information has been obtained for all of the four working areas 260. Steps S41 and S42 are repeatedly implemented until an affirmative decision (YES) is obtained in step S43, that is, until the area-working inhibit/non-inhibit information has been obtained for all of the working areas 260. When the affirmative decision is obtained in step S43, the execution of the routine of FIG. 13 is terminated.

Figure 14:
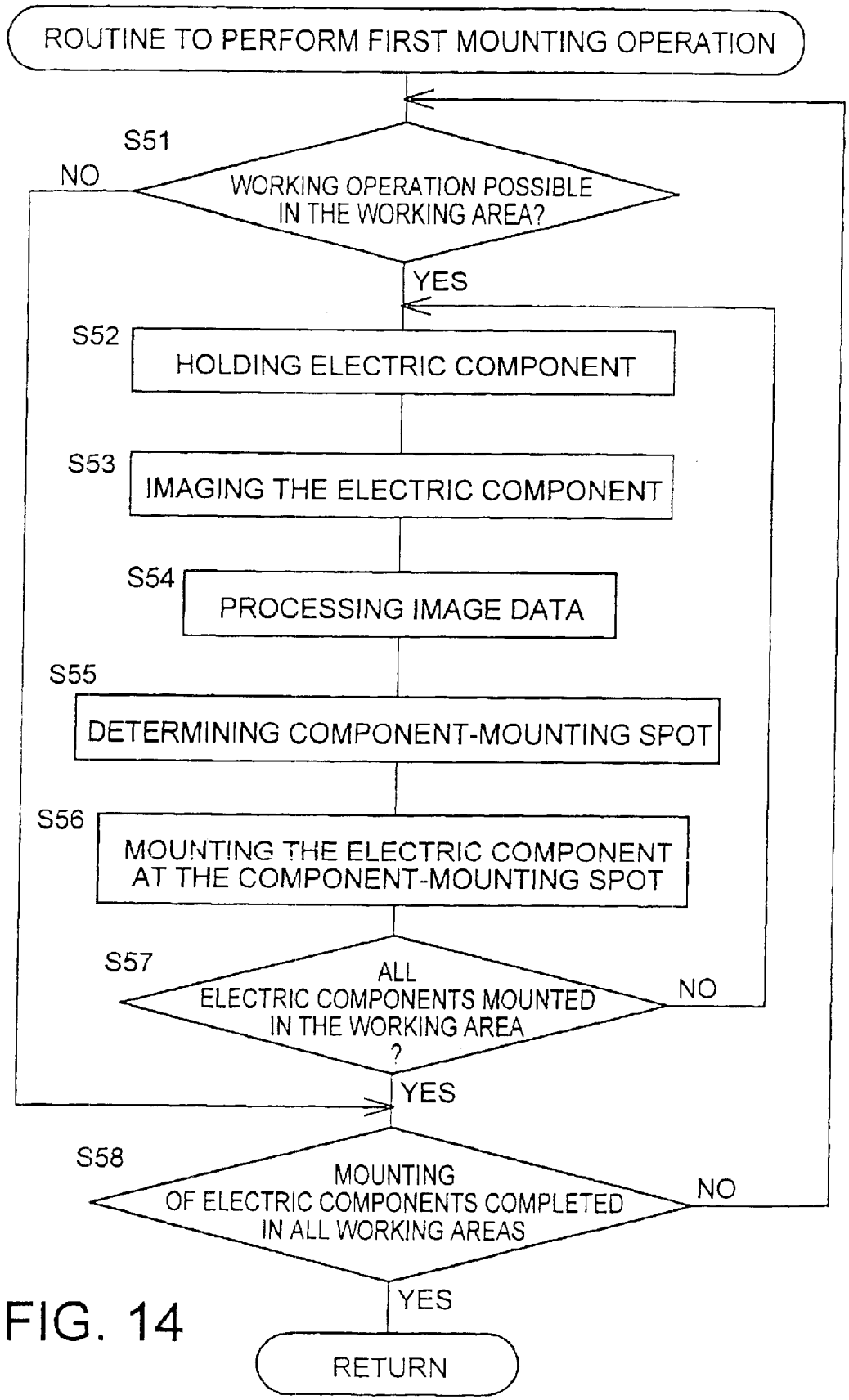
FIG. 14 is a flow chart illustrating a first component-mounting routine executed in the first working process.

After the various kinds of specific information has been obtained for the circuit substrate 52 as described above, the control flow goes to step S5 in which the first mounting operation is performed. This first mounting operation is considered to be a first working operation to be performed on the basis of the obtained various kinds of specific information on the circuit substrate 52. The flow chart of FIG. 14 illustrates a routine to perform the first mounting operation. The operation to mount the electric components 90 in each of the four working areas 260 is controlled according to the component mounting program corresponding to the specific circuit substrate 52 as identified in step S2. The component-mounting operations are sequentially performed in the first through fourth working areas 260 in this order.

The routine of FIG. 14 is initiated with step S51 to determine whether the component-mounting operation is permitted or possible in the working area 260 under examination (in the first working area 260 when step S51 is implemented for the first time). This determination is effected on the basis of the area-working inhibit/non-inhibit information obtained in step S4, more specifically, depending upon whether the INHIBIT flag is set at "0". If this flag is set at "0", it means that the component-mounting operation in the working area 260 in question is permitted, and the control flow goes to step S52 in to initiate the operation to mount the electric component 90 at the predetermined component-mounting spot in the working area 260 in question. Initially, one of the mounting heads 88 of the indexing type mounting assembly 60 which is located at the component-receiving position C is operated to hold the electric component 90 supplied from the selected one of the tape feeders 82. Then, the indexing type mounting assembly 60 is intermittently rotated to turn that mounting head 88 along the circular path of movement. When this mounting head 88 has reached the component-imaging position S, step S53 is implemented to operate the component imaging device 102 to take the image of the electric component 90 as held by the mounting head 88. Step S53 is followed by step S54 in which the image data obtained by the component imaging device 102 are processed to obtain horizontal positioning errors $\Delta Xc$ and $\Delta Yc$ of the electric component 90 with respect to the axis of the mounting head 88, and an angular positioning error $\Delta \theta c$ of the electric component 90 in the rotating direction of the mounting head 88 (in the $\theta$-axis direction). These positioning errors $\Delta Xc$, $\Delta Yc$ and $\Delta \theta c$ are stored in the RAM 124.

Then, the control flow goes to step S55 to determine the component-mounting spot at which the electric component 90 is mounted. Described in detail with respect to the first working area 260, the nominal X-axis and Y-axis positions Xo and Yo of the component-mounting spot and the nominal angular position $\theta$o in which the electric component 90 is mounted at the component-mounting spot are adjusted on the basis of the area-position specifying information in the form of the offset distances $\Delta Xb1$ and $\Delta Yb1$ and the angle $\Delta \theta b1$ of the first working area 260 stored in the RAM 124, and the horizontal and angular positioning errors $\Delta Xc$, $\Delta Yc$ and $\Delta \theta c$ of the electric component 90 also stored in the RAM 124. The above-indicated nominal X-axis and Y-axis positions X0, Y0 and angular position $\theta$o are represented by the component-mounting program. To mount the electric component 90 at the adjusted X-axis and Y-axis positions and in the adjusted angular position, the mounting head 88 is rotated by the mounting-head rotating device 98, to establish the adjusted angular position of the electric component 90, during the movement of the mounting head 88 from the component-imaging position S to the component-mounting position D, and the positioning data for controlling the XY positioning device 56 are adjusted before the movement of the mounting head 88 to the component-mounting position D, so as to move the electric component 90 to the adjusted X-axis and Y-axis positions. Step S55 is followed by step S56 in which the electric component 90 held by the mounting head 88 is mounted at the component-mounting spot determined in step S55, in the angular position determined in step S55.

When the operation to mount one electric component 90 in the first working area 260 is completed, the operation to mount the next electric component 90 is initiated. In this connection, it is noted that the first mounting device 12 using the indexing type mounting assembly 60 is arranged to perform the above-indicated steps S52–S56 sequentially for the successive mounting heads 88 which are assigned to mount the respective electric components 90 at the respective component-mounting spots. When all of the electric components 90 that should be mounted have not been actually mounted in the working area 260 in question, a negative decision (NO) is obtained in step S57, and the control flow goes back to step S52 to repeat the steps S52–S56 to mount the next electric component 90. If all of the electric components 90 have been actually mounted in the working area 260, an affirmative decision (YES) is obtained in step S57, and the control flow goes to step S58 to determine whether the mounting of the electric components 90 in all of the four working areas 260 is completed. If the mounting is not completed in all of the working areas 260, a negative decision (NO) is obtained in step S58, and the control flow goes back to step S51 to mount the electric components 90 in the next working area 260. In the present example of FIG. 9, the component-mounting operation in the third working area 260 is inhibited by the mounting-inhibit mark 268, so that a negative decision (NO) is obtained in step S51 in response to the value "1" of the INHIBIT flag. In this case, the control flow goes to step S58. When the mounting of the electric components 90 in all of the four working areas 260 (except the area 260 provided with the mounting-inhibit mark 268) is completed, an affirmative decision (YES) is obtained in step S58, and the execution of the routine of FIG. 14 is terminated, that is, the first mounting operation by the first mounting device 12 is terminated.

Upon completion of the first mounting operation in step S5, the control flow goes to step S6 in which some of the specific information stored in the RAM 124 of the first mounting-device control device 64, that is, the area-position specifying information and the area-working inhibit/non-inhibit information are transmitted to the system control device 24. In the RAM 124 and the system control device 24, sets of specific information on the different kinds of circuit substrate 52 are stored in relation to the substrate identifiers identifying the kinds of-the circuit substrate 52, as indicated in FIG. 15. The specific information transmitted from the RAM 124 to the system control device 24 is stored in the system control device 24. In this respect, the step S6 is considered to be a step of storing the specific information in the system control device 24. Then, the control flow goes to step S7 in which the circuit substrate 52 is released from the substrate holding device 54, and the first working process in the form of the first component-mounting process is terminated.

There will next be described the second working process performed by the second mounting device 14, by reference to the flow chart of FIG. 16. The second working process is initiated with step S101 in which the circuit substrate 52 transferred from the upstream substrate transferring device 18 is held by the substrate holding device 152, at a position almost aligned with the nominal working position. This step S101 is also a step of holding the circuit substrate 52. Then, the control flow goes to step S102 to obtain the substrate-position information and the substrate identifying information. That is, the step S102 is a combination of a step of identifying the circuit substrate and a step of obtaining the substrate-position information, in the second working process. The step S102 is similar to the step S2, that is, similar to the routine illustrated in the flow chart of FIG. 11. However, the second mounting device 14 uses the single-head type mounting unit 158 movable in the XY plane by the XY robot 160, and the movable component imaging device 162 which is movable with the mounting unit 158. Further, the substrate holding device 152 is not movable, but is fixedly disposed. As in the first working process, the substrate-position information and the substrate identifying information are obtained by simultaneously imaging the first substrate-position fiducial mark 280 and the substrate ID mark 264, processing the thus obtained image data, imaging the second substrate-position fiducial mark 282, and processing the thus obtained image data. As in the first working process, the substrate-position information include horizontal positioning errors $\Delta Xa2$ and $\Delta Ya2$ and an angular positioning error $\Delta \theta a2$ of the circuit substrate 52, which are stored in the RAM 234 of the second mounting-device control device 164. On the basis of the substrate-position information, the working coordinate system is set for defining and commanding the movements of the movable devices such as the XY robot 160 to mount the electric components 90 on the circuit substrate 52.

Then, the control flow goes to step S103 in which the control device 164 of the second mounting device 14 receives the specific information from the system control device 24 to which the specific information has been transmitted from the control device 64 of the first mounting device 12. As described above, the sets of specific information on the different kinds of circuit substrate 52 are stored in the system control device 24, in relation to the substrate identifiers identifying the kinds of the circuit substrate 52. When the second mounting device 14 has received the circuit substrate 52, its control device 164 transmits to the system control device 24 the substrate identifying information identifying the kind of that circuit substrate 52, so that the system control device 24 transmits to the control device 164 the set of specific information corresponding to that kind of the circuit substrate 52. The specific information in the form of the area-position specifying information and the area-working inhibit/non-inhibit information received by the control device 164 is stored in its RAM 234.

After the control device 164 has received the set of specific information on the circuit substrate 52 in question, step S104 is implemented to perform the second working operation in the form of the second mounting operation according to the specific information, in a manner similar to that in the first mounting operation illustrated in the flow chart of FIG. 14. As in the first mounting operation, the electric components 90 are not mounted in the third working area 260 which is provided with the mounting-inhibit mark 268. In the second mounting device 14, the single-head type mounting unit 158 carrying the mounting head 184 is moved by the XY robot 160 to move the electric components 90 at the respective component-mounting spots as adjusted on the basis of the positioning errors of each working area 260 and the positioning errors of each electric component 90 as held by the mounting head 184. After the mounting of all electric components 90 in all of the working areas 260 except the area 260 provided with the mounting-inhibit mark 268 is completed, the control flow goes to step S105 in which the circuit substrate 52 is released from the substrate holding device 152, and the second working process is terminated.

The first and second mounting devices 12, 14 are operated in the manners described above. It will be understood from the foregoing description that the first mounting device 12 serves as a first working device arranged to perform a first working operation on the circuit substrate 52, and includes the XY positioning device 56, component-supplying device 58, indexing type mounting assembly 60, and first mounting-device control device 64, which cooperate to perform the component-mounting operation as the first working operation. It will also be understood that a substrate-position-information obtaining device operable to obtain the substrate-position information includes the substrate imaging device 62, a substrate moving device in the form of the XY positioning device 56 to move the circuit substrate 52 relative to the substrate imaging device 62, and an imaging control device in the form of the first mounting-device control device 64, which is operable to control the substrate imaging device 62 and the substrate moving device. The imaging control device includes the substrate-image-data processing unit 106. The substrate-position-information obtaining device also functions as a specific-information obtaining device operable to obtain the various kinds of specific information on the circuit substrate 52, and also functions as a first substrate identifying device operable to identify the circuit substrate 52 set in the first mounting device 12. From another viewpoint, the imaging control device operable to control the substrate imaging device 62 may be considered to include: a substrate-position-information obtaining control portion operable to control an operation for obtaining the substrate-position information; a substrate-identification control portion operable to control an operation for obtaining the substrate identifying information; a specific-information obtaining control portion operable to control an operation for obtaining the specific information; and a simultaneous-imaging control portion operable to simultaneously image both the substrate-position fiducial mark 280 and the substrate ID mark 264 within the imaging area of the substrate imaging device 62.

It will further be understood from the foregoing description that the second mounting device 14 serves as a second working device arranged to perform a second working operation on the circuit substrate 52, and includes the feeder type component-supplying device 154, tray type component-supplying device 156, single-head type mounting unit 158, XY robot 160, and second mounting-device control device 164, which cooperate to perform the component-mounting operation as the second working operation. It will also be understood that a substrate-position-information obtaining device operable to obtain the substrate-position information in the second mounting device 14 includes the substrate imaging device 162, a substrate-moving device in the form of the XY robot 160 to move the imaging device 162 relative to the circuit substrate 52, and an imaging control device in the form of the second mounting-device control device 164, which is operable to control the substrate imaging device 162 and the imaging-device moving device. The imaging control device includes the substrate-image-data processing unit 226. The substrate-position-information obtaining device also functions as a second substrate identifying device operable to identify the circuit substrate 52 set in the second mounting device 14. From another viewpoint, the imaging control device operable to control the substrate imaging device 162 may be considered to include: a substrate-position-information obtaining control portion operable to control an operation for obtaining the substrate-position information; a substrate-identification control portion operable to control an operation for obtaining the substrate identifying information; and a simultaneous-imaging control portion operable to simultaneously image both the substrate-position fiducial mark 280 and the substrate ID mark 264 within the imaging area of the substrate imaging device 162.

As is apparent from the foregoing description, the second working process does not include steps of obtaining the area-position specifying information specifying the working areas 260, and the area-working inhibit/non-inhibit information indicating whether the working operation is inhibited or permitted in each of the working areas 260. Accordingly, a time required for performing the second working process is reduced. In the present embodiment, the circuit substrate 52 has two spots for the substrate-position fiducial marks 262 (280, 282), eight spots for the area-position fiducial marks 266, and four spots for the mounting-inhibit marks 268. Since the imaging of each spot requires about 0.5 second, it takes about seven seconds to image all of those spots in the first working process, but only about one second in the second working process. Suppose 300 electric components 90 are to be mounted on one circuit substrate 52 and it takes about 0.1 second to mount each electric component 90 on the circuit substrate 52, it takes about 37 seconds to complete the overall component-mounting operation if this operation includes the steps of obtaining the specific information (area-position specifying information and the area-working inhibit/non-inhibit information). That is, the overall component-mounting operation by the first mounting device 12 requires about 37 seconds, but the overall component-mounting operation by the second mounting device 14 requires about 31 seconds. Thus, the productivity of the second or downstream mounting device 14 is improved by about 20% owing to its utilization of the specific information on the circuit substrate 52, which has been obtained by the first or upstream mounting device 12.

<Modified Embodiments>

In the illustrated electric-circuit fabricating system, the specific information which has been obtained by the upstream mounting device, is utilized by the downstream mounting device, and the substrate ID mark 264 is imaged by the substrate imaging device 62 simultaneously with the substrate-position fiducial mark 280. However, the principle of this invention of utilizing the specific information and simultaneously imaging the substrate identifier (substrate ID mark 264) and the substrate-fiducial-position indicator (substrate-position fiducial mark 280) is not limited to the electric-component mounting devices, but is equally applicable to a solder printing device (solder-paste applying device 10), an adhesive applying device (adhesive dispenser), a mounted-component inspecting device. Namely, these working devices may use some kinds of specific information (e.g., the area-position specifying information and area-working inhibit/non-inhibit information described above) on specific circuit substrates on which the working operations are performed. Further, the substrate imaging device used in those working devices to image a substrate-position fiducial mark on the circuit substrate may be used to image the substrate ID mark or identifier simultaneously with the substrate-position fiducial mark. The application of the principle of the present invention to desired working devices operable to perform working operations on circuit substrates makes it possible to improve the operating efficiency of the working devices.

The illustrated electric-circuit fabricating system uses the system control device 24 for effecting a centralized or coordinated control of the system as a whole. However, this system control device 24 may be eliminated. In this case, the substrate identifying information and the specific information are transmitted from the first mounting device 12 directly to the second mounting device 14. That is, the principle of the invention is applicable to a fabricating system including a plurality of working devices which use respective control devices not connected to a system control device.

In the illustrated embodiment, only the sets of specific information obtained by imaging the marks 262, 266, 268 are utilized in relation to the substrate identifying information or substrate identifier. However, any other sets of specific information may be utilized in relation to the substrate identifying information. An example of those other sets of specific information is a set of working-program specifying information which specifies a control program used to control a specific working operation such as a specific component-mounting operation to be performed on the specific circuit substrate which is identified by the substrate identifying information. In this case, various control programs are stored in the system control device, and the control device of each working device is loaded with one of the control programs which is specified by the working-program specifying information in relation to that working device.

In the illustrated embodiment, the substrate ID mark 264 is located near the first substrate-position fiducial mark 280, and these marks 264, 280 are simultaneously imaged by the substrate imaging device 62. However, the substrate ID mark and the substrate-position fiducial mark provided on the circuit substrate may be spaced a relatively large distance from each other. In this case, these two marks are imaged one after another, by moving the substrate imaging device and the circuit substrate relative to each other so that the two marks are sequentially aligned with the substrate imaging device.

While the presently preferred embodiment of the present invention has been described in detail, for illustrative purpose only, it is to be understood that the present invention may be embodied with various changes and improvements, such as those described in the SUMMARY OF THE INVENTION, which may occur to those skilled in the art.

What is claimed is:

1. A method of fabricating an electric circuit, comprising a first working process of performing a predetermined first working operation on a circuit substrate, and a second working process of performing a predetermined second working operation on said circuit substrate after the first working operation, wherein an improvement comprises:

said first working process including a first substrate-identifying step of obtaining substrate identifying information identifying said circuit substrate on which said predetermined first working operation is to be performed, a specific-information obtaining step of recognizing a specific-information providing portion of said circuit substrate, to obtain specific information indicating at least one specific characteristic of said circuit substrate, a first working step of performing said predetermined first working operation on the basis of the obtained specific information, and a specific-information storing step of storing said specific information in relation to said substrate identifying information; and said second working process including a second substrate-identifying step of obtaining said substrate identifying information identifying said circuit substrate on which said predetermined second working operation is to be performed, and a second working step of performing said predetermined second working operation on the basis of said specific information stored in relation to said substrate identifying information.

2. A method according to claim 1, wherein said circuit substrate has at least one working area, and said specific information includes area-working inhibit/non-inhibit information indicating whether the working operation in each of said at least one working area is inhibited or permitted.

3. A method of fabricating an electric circuit, comprising a first working process of performing a predetermined first working operation on a circuit substrate, and a second working process of performing a predetermined second working operation on said circuit substrate after the first working operation, wherein an improvement comprises:

said first working process including a first substrate-identifying step of obtaining substrate identifying information identifying said circuit substrate on which said predetermined first working operation is to be performed, a specific-information obtaining step of recognizing a specific-information providing portion of said circuit substrate, to obtain specific information indicating at least one specific characteristic of said circuit substrate, a first working step of performing said predetermined first working operation on the basis of the obtained specific information and a specific-information storing step of storing said specific information in relation to said substrate identifying information; and said second working process including a second substrate-identifying step of obtaining said substrate identifying information identifying said circuit substrate on which said predetermined second working operation is to be performed, and a second working step of performing said predetermined second working operation on the basis of said specific information stored in relation to said substrate identifying information, and wherein said circuit substrate has at least one working area in which said first working operation is to be performed, and said specific information includes area-position specifying information indicating a position of each of said at least one working area relative to said circuit substrate, said specific-information obtaining step comprises obtaining said area position specifying information of said each at least one working area, on the basis of a position of at least one area-position fiducial mark provided on said circuit substrate.

4. A method according to claim 1, wherein each of said first and second working processes further includes a substrate-holding step of holding said circuit substrate, and a substrate-position-information obtaining step of recognizing a substrate-fiducial-position indicating portion of said circuit substrate, to obtain substrate-position information indicating the position at which said circuit substrate is held, and wherein each of said first and second working operations is performed on the basis of said substrate-position information.

5. A method according to claim 4, wherein said substrate-position indicating portion has at least one substrate-position fiducial mark provided on a surface of said circuit substrate, and said substrate-position-information obtaining step comprises taking an image of each of said at least one substrate-position fiducial mark, and obtaining said substrate-position information on the basis of said image.

6. A method according to claim 5 wherein said circuit substrate has at least one working area, and said specific information includes area-working inhibit/non-inhibit information indicating whether the working operation in each of said at least one working area is inhibited or permitted, and wherein said specific-information providing portion has an area-working inhibit/non-inhibit mark for each of said at least one working area, and said specific-information obtaining step comprises taking an image of said area-working inhibit/non-inhibit mark to obtain said area-working inhibit/non-inhibit information.

7. A method according to claim 6, wherein the image of each of said at least one substrate-position fiducial mark and the image of said area-working inhibit/non-inhibit mark are taken by a same imaging device in said first working process.

8. A method according to claim 5, wherein said circuit substrate has at least one working area, and at least one of said predetermined first and second working operations is performed in said at least one working area, and wherein said specific information includes area-position specifying information indicating a position of each of said at least one working area relative to said circuit substrate, and wherein said specific-information providing portion has an area-position fiducial mark for each of said at least one working area, and said specific-information obtaining step comprises taking an image of said area-position fiducial mark to obtain said area-position specifying information.

9. A method according to claim 8, wherein the image of each of said at least one substrate-position fiducial mark and the image of said area-position fiducial mark are taken by a same imaging device in said first working process.

10. A method according to claim 5, wherein said circuit substrate has a substrate ID mark identifying said circuit substrate, and each of said first substrate-identifying step and said second substrate-identifying step comprises taking an image of said substrate ID mark, to obtain said substrate identifying information identifying said circuit substrate.

11. A method according to claim 10, wherein the image of each of said at least one substrate-position fiducial mark and the image of said substrate ID mark are taken by a same imaging device in each of said first and second working processes.

12. A method according to claim 11, wherein said substrate ID mark is located adjacent to one of said at least one substrate-position fiducial mark, and an image of said substrate ID mark and an image of said one of said at least one substrate-position fiducial mark are simultaneously taken, within an imaging area of said same imaging device.

13. A method according to claim 10, wherein said substrate ID mark consists of a two-dimensional code.

14. A method according to claim 1, wherein each of at least one of said predetermined first and second working operations is selected from a group consisting of: an operation to apply to a surface of said circuit substrate a solder paste for fixing electric components on said surface; an operation to apply to said surface an adhesive for fixing electric components on said surface; an operation to mount electric components on said surface; and an operation to inspect the working operation performed on said surface of the circuit substrate.

15. A method of fabricating an electric circuit, comprising a first working process of performing a predetermined first working operation on a circuit substrate, and a second working process of performing a predetermined second working operation on said circuit substrate after the first working operation, wherein an improvement comprises:

said first working process including a first substrate-identifying step of obtaining substrate identifying information identifying said circuit substrate on which said predetermined first working operation is to be performed, a specific-information obtaining step of recognizing a specific-information providing portion of said circuit substrate, to obtain specific information indicating at least one specific characteristic of said circuit substrate, a first working step of performing said predetermined first working operation on the basis of the obtained specific information, and a specific-information storing step of storing said specific information in relation to said substrate identifying information; and said second working process including a second substrate-identifying step of obtaining said substrate identifying information identifying said circuit substrate on which said predetermined second working operation is to be performed, and a second working step of performing said predetermined second working operation on the basis of said specific information stored in relation to said substrate identifying information, and wherein said second working step of said second working process is an operation to mount electric components on a surface of said circuit substrate.

16. A method according to claim 15, wherein said surface of said circuit substrate has at least one working area in which said electric components are mounted, and said specific information includes area-position specifying information indicating a position of each of said at least one working area relative to said circuit substrate.

17. A method according to claim 15, wherein said first working step of said first working process is an operation to mount on the surface of said circuit substrate electric components other than the electric components to be mounted in said second working step.

18. A method of fabricating an electric circuit, comprising a first working process of performing a predetermined first working operation on a circuit substrate, and a second working process of performing a predetermined second working operation on said circuit substrate after the first working operation, wherein an improvement comprises:

said first working process including a first substrate-identifying step of obtaining substrate identifying information identifying said circuit substrate on which said predetermined first working operation is to be performed, a specific-information obtaining step of recognizing a specific-information providing portion of said circuit substrate, to obtain specific information indicating at least one specific characteristic of said circuit substrate, a first working step of performing said predetermined first working operation on the basis of the obtained specific information, and a specific-information storing step of storing said specific information in relation to said substrate identifying information; and said second working process including a second substrate-identifying step of obtaining said substrate identifying information identifying said circuit substrate on which said predetermined second working operation is to be performed, and a second working step of performing said predetermined second working operation on the basis of said specific information stored in relation to said substrate identifying information, and wherein said circuit substrate has a substrate ID mark identifying said circuit substrate, and each of said first substrate-identifying step and said second substrate-identifying step comprises taking an image of said substrate ID mark, to obtain said substrate identifying information identifying said circuit substrate.

* * * * *